US010430532B2

(12) United States Patent
Han et al.

(10) Patent No.: US 10,430,532 B2
(45) Date of Patent: Oct. 1, 2019

(54) BIDOMAIN SIMULATOR

(71) Applicant: The MathWorks, Inc., Natick, MA (US)

(72) Inventors: Zhi Han, Acton, MA (US); Fu Zhang, Sherborn, MA (US); Murali K. Yeddanapudi, Lexington, MA (US); Pieter J. Mosterman, Framingham, MA (US)

(73) Assignee: The MathWorks, Inc., Natick, MA (US)

(*) Notice: Subject to any disclaimer, the term of this patent is extended or adjusted under 35 U.S.C. 154(b) by 449 days.

(21) Appl. No.: 15/072,183

(22) Filed: Mar. 16, 2016

(65) Prior Publication Data

US 2016/0196376 A1 Jul. 7, 2016

Related U.S. Application Data

(63) Continuation-in-part of application No. 13/652,186, filed on Oct. 15, 2012, now abandoned, which is a continuation-in-part of application No. 13/291,899, filed on Nov. 8, 2011, now Pat. No. 8,914,262, which is a continuation-in-part of application No. 13/291,907, filed on Nov. 8, 2011, now Pat. No. 8,935,137.

(51) Int. Cl.
*G06F 8/10* (2018.01)
*G06F 17/50* (2006.01)

(52) U.S. Cl.
CPC ............ *G06F 17/5009* (2013.01); *G06F 8/10* (2013.01)

(58) Field of Classification Search
CPC .................. G06F 17/5009; G06F 2217/16
See application file for complete search history.

(56) References Cited

U.S. PATENT DOCUMENTS

| 6,226,789 B1 | 5/2001 | Tye et al. |
| 7,904,280 B2 | 3/2011 | Wood |
| 8,156,147 B1 | 4/2012 | Tocci et al. |
| 8,914,262 B2 | 12/2014 | Zhang et al. |

(Continued)

OTHER PUBLICATIONS

Bang Jensen et al., "Digraphs Theory, Algorithms and Applications", Aug. 2007, 772 pages.

(Continued)

*Primary Examiner* — Eunhee Kim
(74) *Attorney, Agent, or Firm* — Cesari and McKenna, LLP.; Michael R. Reinemann

(57) ABSTRACT

A method, performed by a computer device, may include selecting one or more input and output points in an executable graphical model in a modeling application and simulating the executable graphical model over a plurality of time points. The method may further include generating a time domain response plot for the executable graphical model based on the simulating; obtaining matrices of partial derivatives based on the selected one or more input and output points at particular time points of the plurality of time points; generating a frequency domain response plot for the executable graphical model based on the obtained matrices of partial derivatives; and generating a bidomain simulator user interface, the bidomain simulator user interface including the generated time domain response plot and the generated frequency domain response plot.

33 Claims, 13 Drawing Sheets

(56) References Cited

U.S. PATENT DOCUMENTS

| | | | |
|---|---|---|---|
| 8,935,137 B1 | 1/2015 | Han et al. | |
| 2003/0216894 A1* | 11/2003 | Ghaboussi | E02D 1/022 703/2 |
| 2004/0194051 A1* | 9/2004 | Croft | G06F 17/5018 703/2 |
| 2007/0043992 A1 | 2/2007 | Stevenson et al. | |
| 2007/0083347 A1 | 4/2007 | Bollobas et al. | |
| 2007/0157162 A1 | 7/2007 | Ciolfi | |
| 2007/0174030 A1 | 7/2007 | Yun et al. | |
| 2008/0059739 A1 | 3/2008 | Ciolfi et al. | |
| 2009/0012754 A1 | 1/2009 | Mosterman et al. | |
| 2009/0228250 A1 | 9/2009 | Phillips | |
| 2009/0235252 A1 | 9/2009 | Weber et al. | |
| 2010/0017179 A1 | 1/2010 | Wasynczuk et al. | |
| 2010/0057651 A1 | 3/2010 | Fung et al. | |
| 2010/0228693 A1 | 9/2010 | Dawson et al. | |
| 2010/0262568 A1 | 10/2010 | Schwaighofer et al. | |
| 2011/0137632 A1 | 3/2011 | Paxson et al. | |
| 2012/0023477 A1 | 1/2012 | Stevenson et al. | |
| 2013/0116986 A1 | 5/2013 | Zhang et al. | |
| 2013/0116987 A1 | 5/2013 | Zhang et al. | |
| 2013/0116988 A1 | 5/2013 | Zhang et al. | |
| 2013/0116989 A1 | 5/2013 | Zhang et al. | |
| 2013/0198713 A1 | 8/2013 | Zhang et al. | |
| 2015/0095878 A1 | 4/2015 | Zhang et al. | |

OTHER PUBLICATIONS

Bauer, "Computational Graphs and Rounding Error", SIAM Journal on Numerical Analysis, vol. 11 No. 1, Mar. 1974, 10 pages.

Griewank, et al., "Evaluating Derivatives: Principles and Techniques of Algorithmic Differentiation", 2008, 458 pages.

Sezer et al., "Nested Epsilon Decompositions of Linear Systems: Weakly Coupled and Overlapping Blocks", Proceedings of the 1990 Bilkent Conference on New Trends in Communication, Control and Signal Processing, vol. 1, (1990), 13 pages.

Zecevic et al., "Control of Complex Systems—Decompositions of Large-Scale Systems", Chapter 1, Communications and Control Engineering, (2010) 27 pages.

Henzinger, "The Theory of Hybrid Automata", Proceedings of the 11th Symposium on Logic in Computer Science (LICS '96) 1996, 30 pages.

Paliwal et al., "State Space Modeling of a Series Compensated Long Distance Transmission System through Graph Theoretic Approach", IEEE, 1978, 10 pages.

Ilic et al., "A Simple Structural Approach to Modeling and Analysis of the Inter-area Dynamics of the Large Electric Power Systems: Part I—Linearized Models of Frequency Dynamics", 1993 North American Power Symposium, Oct. 11-12, 1993, pp. 560-569.

Ilic et al., "A Simple Structural Approach to Modeling and Analysis of the Inter-area Dynamics of the Large Electric Power Systems: Part 11—Nonlinear Models of Frequency and Voltage Dynamics", Oct. 11-12, 1993, pp. 570-578.

Hiskens, Ian A. and Pai, M.A. "Trajectory Sensitivity Analysis of Hybrid Systems." IEEE Transactions on Circuits and Systems—Part I: Fundamental Theory and Applications, vol. 47, No. 2, Feb. 2000, pp. 204-220.

Hiskens, Ian A. and Pai, M.A. "Power System Applications of Trajectory Sensitivities." IEEE, 2002, pp. 1-6.

Nguyen, Tony B., Pai, M.A, and Hiskens, I.A. "Computation of Critical Values of Parameters in Power Systems Using Trajectory Sensitivities-" 14th PSCC, Sevilla, Jun. 24, 2002, Session 39, Paper 5, pp. 1-6.

Donze, Alexandre and Maler, Oded. "Systematic Simulation using Sensitivity Analysis." Verimag, Gieres, France, pp. 1-16.

Masse, J. "Diffedge: Differentiation, sensitivity analysis and idenfication of hybrid Models." Appedge, Consulting & Engineering, pp. 1-9.

Serban, Radu and Hindmarsh, Alan C. "CVODES: An ODE Solver with Sensitivity Analysis Capabilities." ACM Transactions on Mathematical Software, vol. V, No. N, Sep. 2003, pp. 1-22.

Griewank, Andreas. "A mathematical view of automatic differentiation." Acta Numerica, 2003, pp. 1-78.

Griewank, Andreas and Reese, Shawn. "On the Calculation of Jacobian Matrices by the Markowitz Rule." Mar. 1992, pp. 1-14.

Henzinger, Thomas A. "The Theory of Hybrid Automata." pp. 1-30.

Zecevic, A.I. and Siljak, D.D. "Design of Robust Static Output Feedback for Large-Scale Systems." IEEE Transactions on Automatic Control, vol. 49, No. 11, Nov. 2004, pp. 1-5.

Peponides, George M. and Kokotovic, Petar V. "Weak Connections, Time Scales, and Aggregation of Nonlinear Systems." IEEE Transactions on Automatic Control, vol. AC-28, No. 6, Jun. 1983, pp. 729-735.

Siljak, D.D. "On Stability of Large-Scale Systems under Structural Perturbations." IEEE Transactions on Systems, Man, and Cybernetics, Jul. 1973, pp. 415-417.

Vidyasagar, M. "Decomposition Techniques for Large-Scale Systems with Nonadditive Interactions: Stability and Stabilizability-" IEEE Transactions on Automatic Control, vol. AC-25, No. 4, Aug. 1980, pp. 773-779.

International Search Report and Written Opinion dated Jan. 31, 2013 issued in corresponding PCT application No. PCT/I/US2012/063223, 9 pages.

Donze, Alexandre, et al., "Systematic Simulation Using Sensitivity Analysis," Hybrid Systems: Computation and Control, Springer Berlin Heidelberg, 2007, 174-189.

Frank, "Introduction to System Sensitivity Theory," Academic Press, Inc., 1978, 386 pages.

Ilic et al., "Dynamics and Control of Large Electric Power Systems," John Wiley & Sons, Inc., 2000, 838 pages.

Jamshidi et al., "Applications of Fuzzy Logic Towards High Machine Intelligence Quotient Systems", Environmental and Intelligent Manufacturing Systems Series, Prentice Hall PTR, 1997, 423 pages.

Masse, John, et al., "Differentiation, Sensitivity Analysis and Identification of Hybrid Models Symbolic Derivative of Simulink© Models," in IFIP Conference on System Modeling and Optimization, Jul. 21-25, 2003, pp. 173-183.

Siljak, "Decentralized Control of Complex Systems," Dover Publications, Inc. 1991, 528 pages.

Siljak, "Large-Scale Dynamic Systems—Stability and Structure," Dover Publications, Inc. 1978, 416 pages.

Webster, "Wiley Encyclopedia of Electrical and Electronics Engineering—vol. 11," John Wiley & Sons, Inc., 1999, 763 pages.

Zhou et al., "Essentials of Robust Control", Prentice-Hall, Inc., 1998, 411 pages.

\* cited by examiner

BIDOMAIN SIMULATOR

This application is a continuation-in-part of U.S. patent application Ser. No. 13/652,186, entitled "PARAMETER TUNING" and filed on Oct. 15, 2012, which is a continuation-in-part of U.S. patent application Ser. No. 13/291,899, entitled "VISUALIZATION OF DATA DEPENDENCY IN GRAPHICAL MODELS" and filed on Nov. 8, 2011, which is hereby incorporated by reference in its entirety. U.S. patent. application Ser. No. 13/652,186 is also a continuation-in-part of U.S. patent application Ser. No. 13/291,907, entitled "GRAPH THEORETIC LINEARIZATION AND SENSITIVITY ANALYSIS" and filed on Nov. 8, 2011, which is hereby incorporated by reference in its entirety.

BACKGROUND INFORMATION

A large variety of systems, such as mechanical systems, electrical systems, biological systems, and/or computer systems, may be represented as dynamic systems. Computational tools have been developed to model, simulate, and/or analyze dynamic systems. A computational tool may represent a dynamic system as a graphical model. The graphical model may include blocks that may represent components of the dynamic model. The blocks may have associated parameters. The behavior of the dynamic model represented by the graphical model may depend on values associated with the parameters. Tuning of the values associated with the parameters may enable a user to adjust the behavior of the graphical model.

DETAILED DESCRIPTION OF PREFERRED EMBODIMENTS

Figure 1:
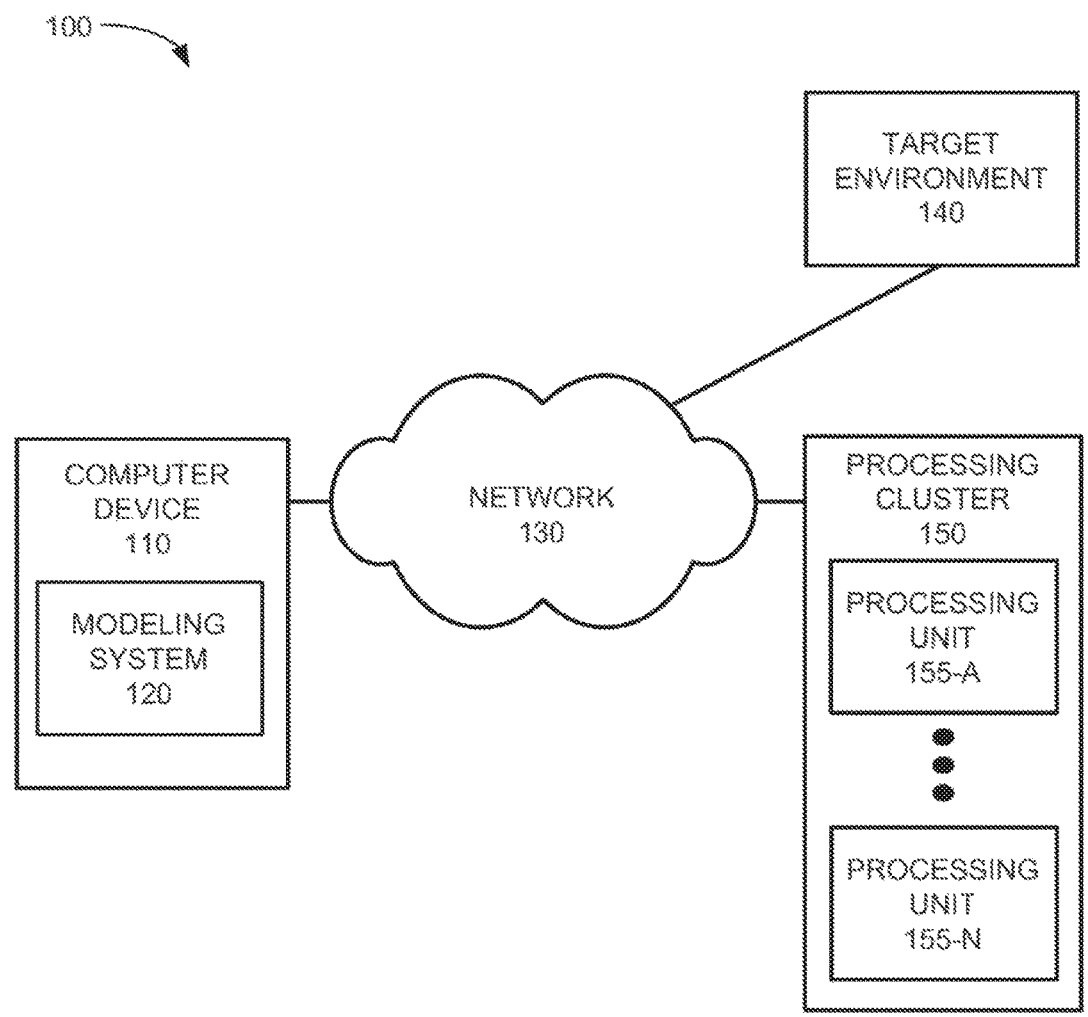
FIG. 1 is a diagram illustrating exemplary components of an environment according to an implementation described herein.

The following detailed description refers to the accompanying drawings. The same reference numbers in different drawings identify the same or similar elements. Also, the following detailed description does not limit the invention.

This application is related to U.S. patent application Ser. No. 13/652,186, filed Oct. 15, 2012, which is incorporated, in its entirety, herein by reference.

An implementation described herein relates to tuning of parameters associated with a graphical model. A dynamic system may be represented by a modeling system as a graphical model that includes one or more associated parameters. The graphical model may be executed to simulate the dynamic system that it represents. The graphical model may be simulated over a time interval and a response may be generated and plotted over the time interval. The user may select to adjust the generated response to a target response. The modeling system may determine one or more adjustments to values associated with the one or more parameters in order to generate the selected target response.

The generated response may be represented as:

$$y_G(t)=f(P_1, \ldots, P_N) \quad \text{Equation (1)}$$

In Equation (1), $y_G(t)$ corresponds to the generated output and $P_1$ to $P_N$ correspond to tunable parameters associated with the graphical model. Thus, the response may be characterized as a function $f$ of parameters $P_1$ to $P_N$. The user may select one or more target data points $y_T(t_1)$, $y_T(t_2), \ldots, y_T(t_m)$ at one or more time points $t_1, t_2, \ldots, t_m$ to define a target response $y_T(t)$. The target response may be represented as $$y_T(t)=f(P_1+\Delta P_1, P_2+\Delta P_2, \ldots, P_N+\Delta P_N) \quad \text{Equation (2)}$$

In Equation (2), $\Delta P_1, \Delta P_2, \ldots, \Delta P_N$ correspond to the adjustment values to parameters $P_1$ to $P_N$ that change the response of the graphical model from the generated response $y_G$ to the selected target response yr. The modeling system may need to determine the values for $\Delta P_1, \Delta P_2, \ldots, \Delta P_N$ based on the change in the response $\Delta y$. A value of a function $y_2=f(P_2)$ may be determined based on a known value at $y_1=f(P_1)$ plus a change $\Delta y=y_2-y_1$, where $\Delta y$ may be estimated by the partial derivative of $f$ with respect to P, times the change in P:

$$\frac{\partial f}{\partial P} \cdot \Delta P.$$

Thus, $\Delta y$ may be represented as:

$$\Delta y = \begin{bmatrix} y_T(t_1) \\ \ldots \\ y_T(t_m) \end{bmatrix} - \begin{bmatrix} y_G(t_1) \\ \ldots \\ y_G(t_m) \end{bmatrix} = \begin{bmatrix} \frac{\partial f}{\partial P_1}\Big|_{t_1} \cdot \Delta P_1 + \frac{\partial f}{\partial P_2}\Big|_{t_1} \cdot \Delta P_2 + \ldots \frac{\partial f}{\partial P_N}\Big|_{t_1} \cdot \Delta P_N \\ \ldots \\ \frac{\partial f}{\partial P_1}\Big|_{t_m} \cdot \Delta P_1 + \frac{\partial f}{\partial P_2}\Big|_{t_m} \cdot \Delta P_2 + \ldots \frac{\partial f}{\partial P_N}\Big|_{t_m} \cdot \Delta P_N \end{bmatrix} \quad \text{Equation (3)}$$

In Equation (3), $$\frac{\partial f}{\partial P_X}\Big|_{t_y}$$

corresponds to the partial derivate of the response function f with respect to parameter $P_x$ at time $t_y$. Equation (3) may be rewritten as:

$$\Delta y = \begin{bmatrix} \frac{\partial f}{\partial P_1}\big|_{t_1} & \cdots & \frac{\partial f}{\partial P_N}\big|_{t_1} \\ & \cdots & \\ \frac{\partial f}{\partial P_1}\big|_{t_m} & \cdots & \frac{\partial f}{\partial P_N}\big|_{t_m} \end{bmatrix} \cdot \begin{bmatrix} \Delta P_1 \\ \cdots \\ \Delta P_N \end{bmatrix} = J_P \cdot \Delta P \quad \text{Equation (4)}$$

In Equation (4), $J_P$ corresponds to the parameter Jacobian matrix. Solving for the adjustment values to the parameters, $\Delta P$, yields:

$$\Delta P = J_P^{-1} \cdot \Delta y \quad \text{Equation (5)}$$

In Equation (5), $J_P^{-1}$ to the inverse parameter Jacobian matrix. Thus, to determine the adjustment values to the parameters, $\Delta P$, an inverse of the parameter Jacobian matrix may need to be determined. An implementation described herein relates to receiving a selection of one or more target output points in relation to a response generated for a graphical model during a simulation, receiving a selection of one or more parameters to tune, determining an inverse parameter Jacobian matrix based on a parameter Jacobian matrix associated with the graphical model, and determining one or more adjustments to the selected one or more parameters to tune based on the selected one or more target output points and based on the determined inverse parameter Jacobian matrix.

If the number of selected target response points equals the number of selected parameters to tune, $J_P$ may correspond to a square matrix that is invertible and a unique solution may exist for $\Delta P$. If the number of selected target points is less than the number of selected parameters to tune, multiple solutions may exist for $\Delta P$ and a solution may be selected by one or more optimization criteria and/or a user may be provided with the multiple solutions and may select one of the multiple solutions. If the number of selected target points is greater than the number of selected parameters to tune, no unique solution may exist for $\Delta P$ and $\Delta P$ may be approximated (e.g., using linear regression analysis).

As mentioned above, in order to determine $\Delta P$, an inverse of a parameter Jacobian matrix may be determined for the graphical model. A parameter Jacobian matrix for a graphical model may be determined as follows.

The graphical model may include one or more blocks. A block may be characterized by the following equations:

$$x' = f(x, u, t)$$

$$y = g(x, u, t) \quad \text{Equation (6)}$$

In Equation (6), x may represent the states of the block, u may represent inputs to the block, t may represent a time variable, and y may represent outputs of the block. An example of a block that may be associated with a state may be an integrator block. An integrator block may convert a dx/dt signal (i.e., the derivative of x with respect to t) to an x signal. The function $f$, also called the derivative function, may characterize the rate of change of the state variables of the block as a function of the states, inputs and time. The variables x, u, and y may be vectors. The function g, also called the output function, may characterize the outputs of the block as a function of the states, inputs, and time. While implementations described herein may be described as continuous functions and/or blocks, the implementations described herein may be applied to discrete functions and/or blocks, or to combinations of continuous and discrete functions and/or blocks. For a discrete block, the derivative function may be replaced by an update function and the time variable may be replaced by a time delay variable.

A block Jacobian matrix J for a block may be defined as follows:

$$J = \begin{bmatrix} \frac{\partial f}{\partial x} & \frac{\partial f}{\partial u} \\ \frac{\partial g}{\partial x} & \frac{\partial g}{\partial u} \end{bmatrix} = \begin{bmatrix} A & B \\ C & D \end{bmatrix} \quad \text{Equation (7)}$$

Thus, in the block Jacobian matrix, sub-matrix A may correspond to a matrix that defines the partial derivatives of the derivative function with respect to the states, sub-matrix B may correspond to a matrix that defines the partial derivatives of the derivative function with respect to the inputs, sub-matrix C may correspond to a matrix that defines the partial derivatives of the output function with respect to the states, and sub-matrix D may correspond to a matrix that defines the partial derivatives of the output function with respect to the inputs.

The block Jacobian matrix may be a time varying matrix. In other words, the values of the elements of the block Jacobian matrix may vary with time. For example, assume a block is defined by the following equations:

$$x_1' = x_2^2$$

$$x_2' = x_1 + x_2 \quad \text{Equation (8)}$$

The corresponding A matrix of the block Jacobian matrix may be:

$$A = \begin{bmatrix} 0 & 2x_2 \\ 1 & 1 \end{bmatrix} \quad \text{Equation (9)}$$

A graphical model may include multiple blocks. An open loop Jacobian matrix may be determined for a graphical model by the following process. Block Jacobian matrices may be determined for the blocks included in the graphical model. A block Jacobian matrix for a block may be defined by a user, may be determined analytically from one or more equations that are associated with the block, and/or may be determined numerically using a perturbation algorithm. The block Jacobian matrices associated with individual blocks of the graphical model may be concatenated into a single block Jacobian matrix.

For example, assume a graphical model includes a set of blocks $\{b_1, \ldots, b_n\}$ with a subset of blocks $\{b_{i_1}, \ldots, b_{i_{n_x}}\}$ that include internal states. The concatenated block Jacobian matrix, also known as the open loop Jacobian matrix, may be defined as:

$$A_0 = \begin{bmatrix} A_1 & & \\ & \cdots & \\ & & A_{n_x} \end{bmatrix} \quad B_0 = \begin{bmatrix} B_1 & & \\ & \cdots & \\ & & B_{n_x} \end{bmatrix} \quad \text{Equation (10)}$$

$$C_0 = \begin{bmatrix} C_1 & & \\ & \cdots & \\ & & C_{n_x} \end{bmatrix} \quad D_0 = \begin{bmatrix} D_1 & & \\ & \cdots & \\ & & D_{n_x} \end{bmatrix}$$

A block may be associated with one or more parameters. The block, associated with the one or more parameters, may correspond to a state-less block or to a block with one or more states. A block with one or more states may be re-modeled as a subsystem that includes one or more state-less blocks and one or more blocks with the one or more states, where the one or more parameters are associated with the one or more parameters. Thus, a block parameter may be modeled as being associated with a state-less block. Modifying function g(x,u,t) from Equation (1) to include the effects of one or more parameters p may result in:

$$y = g(x,u,p,t) \qquad \text{Equation (11)}$$

The rate of change of output y with respect to a parameter p may be determined by:

$$\frac{\partial y}{\partial p} = \frac{\partial g(x, u, p, t)}{\partial p} \qquad \text{Equation (12)}$$

One example of a block that may be associated with a parameter may be a constant block. A constant block may generate a constant signal and the constant value may be interpreted as a parameter. For a constant block associated with a constant value of k, characterized by g(x,u,p,t)=k, the rate of change of the output with respect to the parameter may be determined by:

$$\frac{\partial y}{\partial p} = \frac{\partial k}{\partial p} = 1 \qquad \text{Equation (13)}$$

Another example of a block that may be associated with a parameter may be a gain block. A gain block may multiply an input signal by a gain value and the gain value may be interpreted as a parameter. For a gain block with a gain value of p, characterized by g(x,u,p,t)=p*u, with u corresponding to the input signal, the rate of change of the output with respect to the parameter may be determined by:

$$\frac{\partial y}{\partial p} = \frac{\partial (p \cdot u)}{\partial p} = u \qquad \text{Equation (14)}$$

For other types of blocks, a parameter may be treated as an input signal into the block. Thus, a block may be re-modeled as including an additional input for each parameter of interest and the block Jacobian for the remodeled block may be determined. As the parameter Jacobian $J_P$ measures the rate of change of the output with respect to the parameters, the parameter Jacobian $J_P$ may be included as a sub-matrix of sub-matrix D of the block Jacobian associated with the re-modeled block. For example, if a block includes inputs $(u_1, \ldots, u_j)$, outputs $(y_1, \ldots, y_k)$, and parameters $(P_1, \ldots, P_N)$, the block may be re-modeled as including inputs $(u_1, \ldots, u_j, P_1, \ldots, P_N)$ and outputs $(y_1, \ldots, y_k)$. Sub-matrix D of the block Jacobian of the re-modeled block, $J^R_D$, may correspond to:

$$J^R_D = \begin{bmatrix} \frac{\partial y_1}{\partial u_1} & \cdots & \frac{\partial y_1}{\partial u_j} & \frac{\partial y_1}{\partial P_1} & \cdots & \frac{\partial y_1}{\partial P_N} \\ & & \cdots & & & \\ \frac{\partial y_k}{\partial u_1} & \cdots & \frac{\partial y_k}{\partial u_j} & \frac{\partial y_k}{\partial P_1} & \cdots & \frac{\partial y_k}{\partial P_N} \end{bmatrix} \qquad \text{Equation (15)}$$

The parameter Jacobian matrix $J_P$ may correspond to the following sub-matrix of $J^R_D$:

$$J_P = \begin{bmatrix} \frac{\partial y_1}{\partial P_1} & \cdots & \frac{\partial y_1}{\partial P_N} \\ & \cdots & \\ \frac{\partial y_k}{\partial P_1} & \cdots & \frac{\partial y_k}{\partial P_N} \end{bmatrix} \qquad \text{Equation (16)}$$

FIG. 1 is a diagram of an exemplary environment 100 according to an implementation described herein. As shown in FIG. 1, environment 100 may include a computer device 110, a network 130, a target environment 140, and a processing cluster 150.

Computer device 110 may include one or more computer devices, such as a personal computer, a workstation, a server device, a blade server, a mainframe, a personal digital assistant (PDA), a laptop, a tablet, or another type of computation or communication device. Computer device 110 may include a modeling system 120. Modeling system 120 may include a development tool that enables creation, modification, design, and/or simulation of graphical models representing dynamic systems. Furthermore, modeling system 120 may enable the generation of executable code based on a graphical model. Modeling system 120 may perform parameter tuning for one or more parameters associated with the graphical model.

Network 130 may enable computer device 110 to communicate with other components of environment 100, such as target environment 140 and/or processing cluster 150. Network 130 may include one or more wired and/or wireless networks. For example, network 130 may include a cellular network, the Public Land Mobile Network (PLMN), a second generation (2G) network, a third generation (3G) network, a fourth generation (4G) network (e.g., a long term evolution (LTE) network), a fifth generation (5G) network, a code division multiple access (CDMA) network, a global system for mobile communications (GSM) network, a general packet radio services (GPRS) network, a Wi-Fi network, an Ethernet network, a combination of the above networks, and/or another type of wireless network. Additionally, or alternatively, network 130 may include a local area network (LAN), a wide area network (WAN), a metropolitan area network (MAN), an ad hoc network, an intranet, the Internet, a fiber optic-based network (e.g., a fiber optic service network), a satellite network, a television network, and/or a combination of these or other types of networks.

Target environment 140 may include one or more devices that may be associated with a dynamic system that is represented by a graphical model in modeling system 120. For example, target environment 140 may include a set of sensors and/or a set of controllers corresponding to a dynamic system. Modeling system 120 may receive data from target environment 140 and use the received data as input to the graphical model. Furthermore, target environment 140 may receive executable code from modeling system 120. The received executable code may enable target environment 140 to perform one or more operations on the dynamic system associated with target environment 140 such as, for example processor-in-the-loop (PiL) operations, software-in-the-loop (SiL) operations, hardware-in-the-loop (HiL) operations, etc.

Processing cluster 150 may include processing resources which may be used by modeling system 120 in connection with a graphical model. For example, processing cluster 150 may include processing units 155-A to 155-N (referred to herein collectively as "processing units 155" and individually as "processing unit 155"). Processing units 155 may perform operations on behalf of computer device 110. For example, processing units 155 may perform parallel processing on a graphical model in modeling system 120. Modeling system 120 may provide an operation to be performed to processing cluster 150, processing cluster 150 may divide tasks associated with the operation among processing units 155, processing cluster 150 may receive results of the performed tasks from processing units 155, and may generate a result of the operation and provide the result of the operation to modeling system 120.

In one implementation, processing unit 155 may include a graphic processing unit (GPU). A GPU may include one or more devices that include specialized circuits for performing operations relating to graphics processing (e.g., block image transfer operations, simultaneous per-pixel operations, etc.) and/or for performing a large number of operations in parallel. In another example, processing unit 155 may include a field programmable gate array (FPGA). In yet another example, processing unit 155 may correspond to a single core of a multi-core processor. In yet another example, processing unit 155 may include a computer device that is part of a cluster of computer devices.

Although FIG. 1 shows exemplary components of environment 100, in other implementations, environment 100 may include fewer components, different components, differently arranged components, and/or additional components than those depicted in FIG. 1. Alternatively, or additionally, one or more components of environment 100 may perform one or more tasks described as being performed by one or more other components of environment 100.

Figure 2:
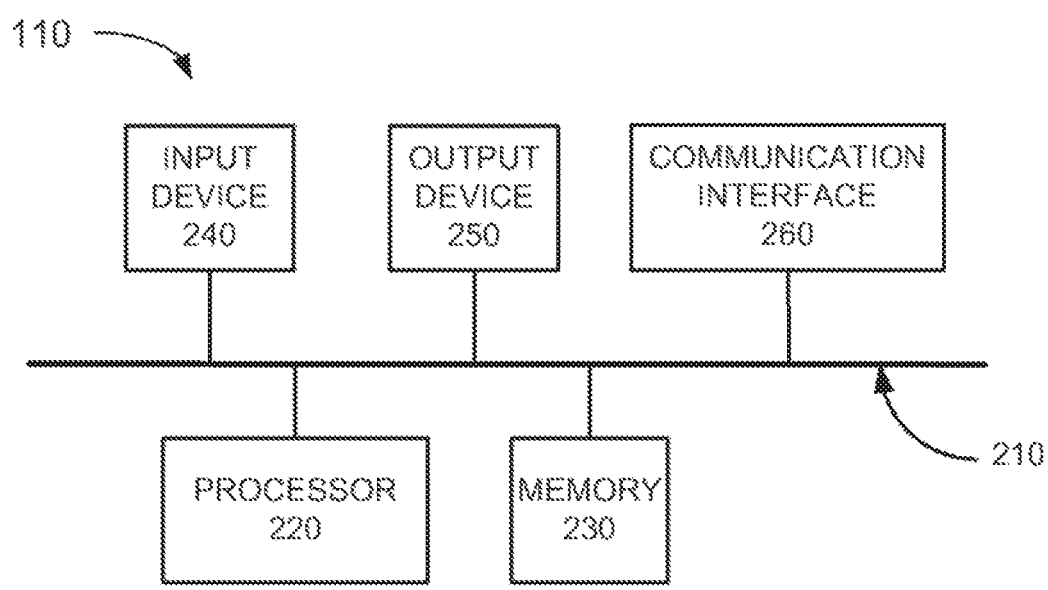
FIG. 2 is a diagram illustrating exemplary components of the computer device of FIG. 1.

FIG. 2 is a diagram illustrating exemplary components of computer device 110 according to a first implementation described herein. As shown in FIG. 2, computer device 110 may include a bus 210, a processor 220, a memory 230, an input device 240, an output device 250, and a communication interface 260.

Bus 210 may include a path that permits communication among the components of computer device 200. Processor 220 may include one or more single-core and/or or multi-core processors, microprocessors, and/or processing logic (e.g., application specific integrated circuits (ASICs), field programmable gate arrays (FPGAs), Advanced RISC Machines (ARM) processors, etc.) that may interpret and execute instructions. Memory 230 may include a random access memory (RAM) device or another type of dynamic storage device that may store information and instructions for execution by processor 220, a read only memory (ROM) device or another type of static storage device that may store static information and instructions for use by processor 220, a magnetic and/or optical recording memory device and its corresponding drive, and/or a removable form of memory, such as a flash memory.

Input device 240 may include a mechanism that permits an operator to input information to computer device 110, such as a keypad, a keyboard, a touch screen, a button, or an input jack for an input device such as a keypad or a keyboard, a camera, a microphone, an analog to digital (ADC) converter, a pulse-width modulation (PWD) input, etc. Output device 250 may include a mechanism that outputs information to the operator, including one or more light indicators, a display, a touch screen, a speaker, a digital to analog (DAC) converter, a PWM output, etc.

Communication interface 260 may include a transceiver that enables computer device 110 to communicate with other devices and/or systems. For example, communication interface 260 may include a modem, a network interface card, and/or a wireless interface card.

As will be described in detail below, computer device 110 may perform certain operations relating to parameter tuning. Computer device 110 may perform these operations in response to processor 220 executing software instructions stored in a computer-readable medium, such as memory 230. A computer-readable medium may be defined as a non-transitory memory device. A memory device may include memory space within a single physical memory device or spread across multiple physical memory devices.

The software instructions may be read into memory 230 from another computer-readable medium, or from another device via communication interface 260. The software instructions contained in memory 230 may cause processor 220 to perform processes that will be described later. Alternatively, hardwired circuitry may be used in place of or in combination with software instructions to implement processes described herein. Thus, implementations described herein are not limited to any specific combination of hardware circuitry and software.

Although FIG. 2 shows exemplary components of computer device 110, in other implementations, computer device 110 may include fewer components, different components, additional components, or differently arranged components than depicted in FIG. 2. Additionally or alternatively, one or more components of computer device 110 may perform one or more tasks described as being performed by one or more other components of computer device 200.

Figure 3:
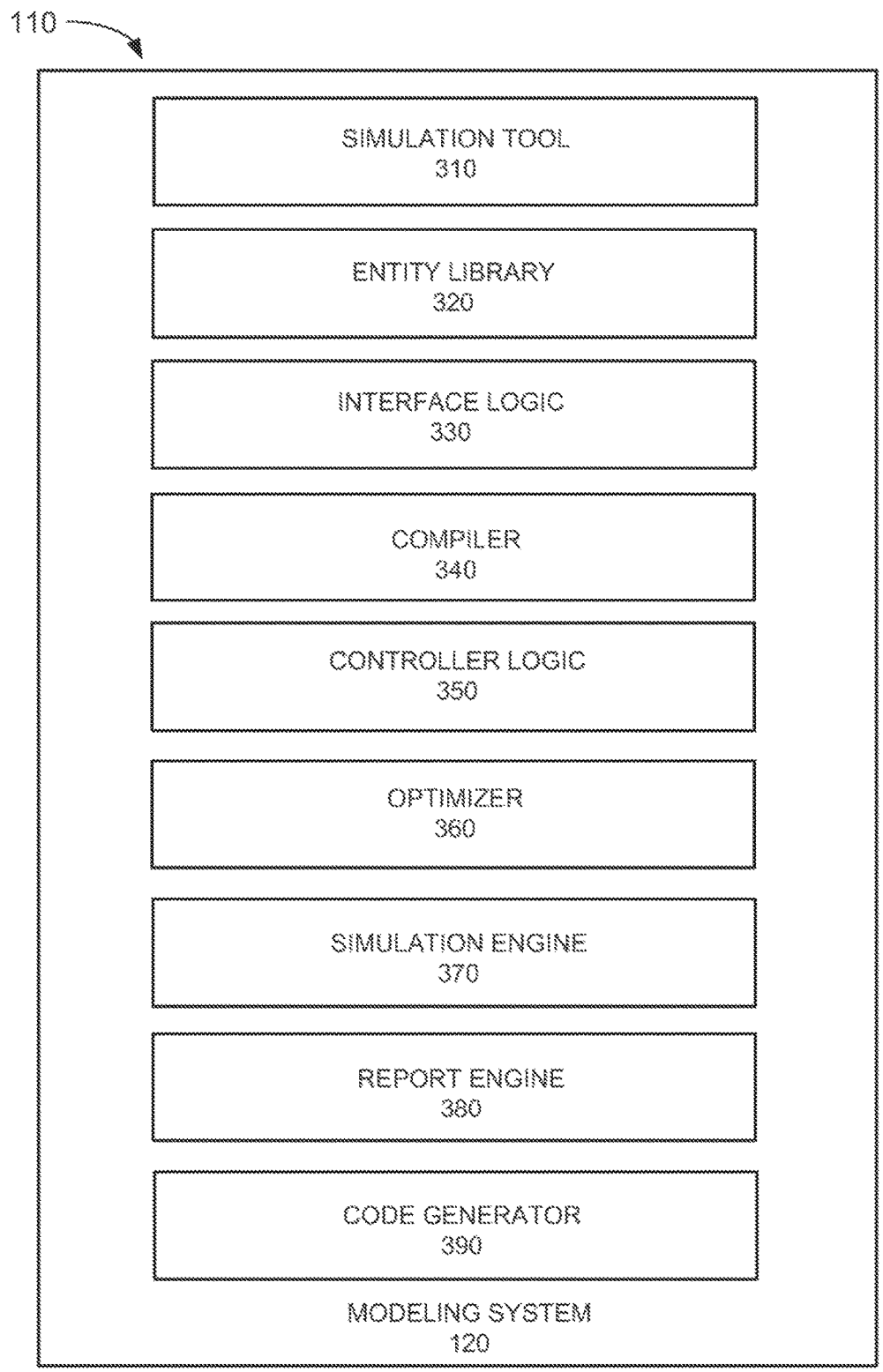
FIG. 3 is a diagram of exemplary components of a modeling system that may be included in the computer device of FIG. 1.

FIG. 3 is a diagram of exemplary components of modeling system 120 that may be included in computer device 110. Modeling system 120 may include a development tool that enables existing software components to be used in the creation of a model and that may enable generation of executable code based on the model. For example, the development tool may include a graphical modeling tool or an application that provides a user interface for a numerical computing environment. Additionally, or alternatively, the development tool may include a graphical modeling tool and/or an application that provides a user interface for modeling and executing a dynamic system (e.g., based on differential equations, difference equations, algebraic equations, discrete events, discrete states, stochastic relations, etc.).

A dynamic system (either natural or man-made) may be a system whose response at any given time may be a function of its input stimuli, its current state, and a current time. Such systems may range from simple to highly complex systems. Natural dynamic systems may include, for example, a falling body, the rotation of the earth, bio-mechanical systems (muscles, joints, etc.), bio-chemical systems (gene expression, protein pathways), weather, and climate pattern systems, and/or any other natural dynamic system. Man-made or engineered dynamic systems may include, for example, a bouncing ball, a spring with a mass tied on an end, automobiles, airplanes, control systems in major appliances, communication networks, audio signal processing systems, a financial or a stock market system, and/or any other man-made or engineered dynamic system.

The system represented by a model may have various execution semantics that may be represented in the model as a collection of modeling entities, often referred to as blocks. A block may generally refer to a portion of functionality that may be used in the model. The block may be represented graphically, textually, and/or stored in some form of internal representation. Also, a particular visual depiction used to represent the block, for example in a graphical block diagram, may be selected by a user.

A block may be hierarchical in that the block itself may comprise one or more blocks that make up the block. A block comprising one or more blocks (sub-blocks) may be referred to as a subsystem block. A subsystem block may be configured to represent a subsystem of the overall system represented by the model. A subsystem may be a masked subsystem that is configured to have a logical workspace that contains variables only readable and writeable by elements contained by the subsystem.

A graphical model (e.g., a functional model) may include entities with relationships between the entities, and the relationships and/or the entities may have attributes associated with them. The entities may include model elements such as blocks and/or ports. The relationships may include model elements such as lines (e.g., connector lines) and references. The attributes may include model elements such as value information and meta information for the model element associated with the attributes. A graphical model may be associated with configuration information. The configuration information may include information for the graphical model such as model execution information (e.g., numerical integration schemes, the fundamental execution period, etc.), model diagnostic information (e.g., whether an algebraic loop should be considered an error or result in a warning), model optimization information (e.g., whether model elements should share memory during execution), model processing information (e.g., whether common functionality should be shared in code that is generated for a model), etc.

Additionally, or alternatively, a graphical model may have executable semantics and/or may be executable. An executable graphical model may be a time based block diagram. A time based block diagram may consist, for example, of blocks connected by lines (e.g., connector lines). The blocks may consist of elemental dynamic systems such as a differential equation system (e.g., to specify continuous-time behavior), a difference equation system (e.g., to specify discrete-time behavior), an algebraic equation system (e.g., to specify constraints), a state transition system (e.g., to specify finite state machine behavior), an event based system (e.g., to specify discrete event behavior), etc. The lines may represent signals (e.g., to specify input/output relations between blocks or to specify execution dependencies between blocks), variables (e.g., to specify information shared between blocks), physical connections (e.g., to specify electrical wires, pipes with volume flow, rigid mechanical connections, etc.) etc. The attributes may consist of meta information such as sample times, dimensions, complexity (whether there is an imaginary component to a value), data type, etc. associated with the model elements.

In a time based block diagram, ports may be associated with blocks. A relationship between two ports may be created by connecting a line (e.g., a connector line) between the two ports. Lines may also, or alternatively, be connected to other lines, for example by creating branch points. For instance, three or more ports can be connected by connecting a line to each of the ports, and by connecting each of the lines to a common branch point for all of the lines. A common branch point for the lines that represent physical connections may be a dynamic system (e.g., by summing all variables of a certain type to 0 or by equating all variables of a certain type). A port may be an input port, an output port, an enable port, a trigger port, a function-call port, a publish port, a subscribe port, an exception port, an error port, a physics port, an entity flow port, a data flow port, a control flow port, etc.

Relationships between blocks may be causal and/or non-causal. For example, a model (e.g., a functional model) may include a block that represents a continuous-time integration block that may be causally related to a data logging block by using a line (e.g., a connector line) to connect an output port of the continuous-time integration block to an input port of the data logging block. Further, during execution of the model, the value stored by the continuous-time integrator may change as the current time of the execution progresses. The value of the state of the continuous-time integrator may be available on the output port and the connection with the input port of the data logging black may make this value available to the data logging block.

In one example, a block may include or otherwise correspond to a non-causal modeling function or operation. An example of a non-causal modeling function may include a function, operation, or equation that may be executed in different fashions depending on one or more inputs, circumstances, and/or conditions. Put another way, a non-causal modeling function or operation may include a function, operation, or equation that does not have a predetermined causality. For instance, a non-causal modeling function may include an equation (e.g., $X=2Y$) that can be used to identify the value of one variable in the equation (e.g., "X") upon receiving an assigned value corresponding to the other variable (e.g., "Y"). Similarly, if the value of the other variable (e.g., "Y") were provided, the equation could also be used to determine the value of the one variable (e.g., "X").

Assigning causality to equations may consist of determining which variable in an equation is computed by using that equation. Assigning causality may be performed by sorting algorithms, such as a Gaussian elimination algorithm. The result of assigning causality may be a lower block triangular matrix that represents the sorted equations with strongly connected components representative of algebraic loops. Assigning causality may be part of model compilation.

Equations may be provided in symbolic form. A set of symbolic equations may be symbolically processed to, for example, produce a simpler form. To illustrate, a system of two equations $X=2Y+U$ and $Y=3X-2U$ may be symbolically processed into one equations $5Y=-U$. Symbolic processing of equations may be part of model compilation.

As such, a non-causal modeling function may not, for example, require a certain input or type of input (e.g., the value of a particular variable) in order to produce a valid output or otherwise operate as intended. Indeed, the operation of a non-causal modeling function may vary based on, for example, circumstance, conditions, or inputs corresponding to the non-causal modeling function. Consequently, while the description provided above generally describes a directionally consistent signal flow between blocks, in other implementations, the interactions between blocks may not necessarily be directionally specific or consistent.

In an embodiment, connector lines in a model may represent related variables that are shared between two connected blocks. The variables may be related such that their combination may represent power. For example, connector lines may represent voltage, and current, power, etc. Additionally, or alternatively, the signal flow between blocks may be automatically derived.

In some implementations, one or more of blocks may also, or alternatively, operate in accordance with one or more rules or policies corresponding to a model in which they are included. For instance, if the model were intended to behave as an actual, physical system or device, such as an electronic circuit, the blocks may be required to operate within, for example, the laws of physics (also referred to herein as "physics-based rules"). These laws of physics may be formulated as differential and/or algebraic equations (e.g., constraints, etc.). The differential equations may include derivatives with respect to time, distance, and/or other quantities, and may be ordinary differential equations (ODEs), partial differential equations (PDEs), and/or differential and algebraic equations (DAEs). Requiring models and/or model components to operate in accordance with such rules or policies may, for example, help ensure that simulations based on such models will operate as intended.

A sample time may be associated with the elements of a graphical model. For example, a graphical model may comprise a block with a continuous sample time such as a continuous-time integration block that may integrate an input value as time of execution progresses. This integration may be specified by a differential equation. During execution the continuous-time behavior may be approximated by a numerical integration scheme that is part of a numerical solver. The numerical solver may take discrete steps to advance the execution time, and these discrete steps may be constant during an execution (e.g., fixed step integration) or may be variable during an execution (e.g., variable-step integration).

Alternatively, or additionally, a graphical model may comprise a block with a discrete sample time such as a unit delay block that may output values of a corresponding input after a specific delay. This delay may be a time interval and this interval may determine a sample time of the block. During execution, the unit delay block may be evaluated each time the execution time has reached a point in time where an output of the unit delay block may change. These points in time may be statically determined based on a scheduling analysis of the graphical model before starting execution.

Alternatively, or additionally, a graphical model may comprise a block with an asynchronous sample time, such as a function-call generator block that may schedule a connected block to be evaluated at a non-periodic time. During execution, a function-call generator block may evaluate an input and when the input attains a specific value when the execution time has reached a point in time, the function-call generator block may schedule a connected block to be evaluated before advancing execution time.

Further, the values of attributes of a graphical model may be inferred from other elements of the graphical model or attributes of the graphical model. The inferring may be part of a model compilation. For example, the graphical model may include a block, such as a unit delay block, that may have an attribute that specifies a sample time of the block. When a graphical model has an execution attribute that specifies a fundamental execution period, the sample time of the unit delay block may be inferred from this fundamental execution period.

As another example, the graphical model may include two unit delay blocks where the output of the first of the two unit delay blocks is connected to the input of the second of the two unit delay block. The sample time of the first unit delay block may be inferred from the sample time of the second unit delay block. This inference may be performed by propagation of model element attributes such that after evaluating the sample time attribute of the second unit delay block, a graph search proceeds by evaluating the sample time attribute of the first unit delay block since it is directly connected to the second unit delay block.

The values of attributes of a graphical model may be set to characteristics settings, such as one or more inherited settings, one or more default settings, etc. For example, the data type of a variable that is associated with a block may be set to a default such as a double. Because of the default setting, an alternate data type (e.g., a single, an integer, a fixed point, etc.) may be inferred based on attributes of elements that the graphical model comprises (e.g., the data type of a variable associated with a connected block) and/or attributes of the graphical model. As another example, the sample time of a block may be set to be inherited. In case of an inherited sample time, a specific sample time may be inferred based on attributes of elements that the graphical model comprises and/or attributes of the graphical model (e.g., a fundamental execution period).

Modeling system 120 may implement a technical computing environment (TCE). A TCE may include hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Java, etc.

In one implementation, the TCE may include a dynamically typed language that can be used to express problems and/or solutions in mathematical notations familiar to those of skill in the relevant arts. For example, the TCE may use an array as a basic element, where the array may not require dimensioning. In addition, the TCE may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state based analysis and/or design, etc.

The TCE may further provide mathematical functions and/or graphical tools (e.g., for creating plots, surfaces, images, volumetric representations, etc.). In one implementation, the TCE may provide these functions and/or tools using toolboxes (e.g., toolboxes for signal processing, image processing, data plotting, parallel processing, etc.). In another implementation, the TCE may provide these functions as block sets. In still another implementation, the TCE may provide these functions in another way, such as via a library, etc. The TCE may be implemented as a text based environment, a graphically based environment, or another type of environment, such as a hybrid environment that is both text and graphically based.

The TCE may be implemented using products such as, but not limited to, MATLAB® by The MathWorks, Inc.; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dassault Systemes.

An alternative embodiment may implement a TCE in a graphically-based TCE using products such as, but not limited to, Simulink®, Stateflow®, SimEvents®, etc., by The MathWorks, Inc.; VisSim by Visual Solutions; Lab- View® by National Instruments; Dymola by Dassault Systemes; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; Ptolemy from the University of California at Berkeley; or aspects of a Unified Modeling Language (UML) or SysML environment.

A further alternative embodiment may be implemented in a language that is compatible with a product that includes a TCE, such as one or more of the above identified text-based or graphically-based TCE's. For example, MATLAB (a text-based TCE) may use a first command to represent an array of data and a second command to transpose the array. Another product, that may or may not include a TCE, may be MATLAB-compatible and may be able to use the array command, the array transpose command, or other MATLAB commands. For example, the other product may use the MATLAB commands to perform model checking.

Yet another alternative embodiment may be implemented in a hybrid TCE that combines features of a text-based and graphically-based TCE. In one implementation, one TCE may operate on top of the other TCE. For example, a text-based TCE (e.g., MATLAB) may operate as a foundation and a graphically-based TCE (e.g., Simulink) may operate on top of MATLAB and may take advantage of text-based features (e.g., commands) to provide a user with a graphical user interface and graphical outputs (e.g., graphical displays for data, dashboards, etc.).

As shown in FIG. 3, modeling system 120 may include a simulation tool 310, an entity library 320, an interface logic 330, a compiler 340, a controller logic 350, an optimizer 360, a simulation engine 370, a report engine 380, and a code generator 390.

Simulation tool 310 may include an application for building a model. Simulation tool 310 may be used to build a textual model or a graphical model having executable semantics. In the case of graphical models, simulation tool 310 may allow users to create, display, modify, diagnose, annotate, delete, print, etc., model entities and/or connections. Simulation tool 310 may interact with other entities illustrated in FIG. 1 for receiving user inputs, executing a model, displaying results, generating code, etc. Simulation tool 310 may provide a user with an editor for constructing or interacting with textual models and/or a GUI for creating or interacting with graphical models. The editor may be configured to allow a user to, for example, specify, edit, annotate, save, print, and/or publish a model. A textual interface may be provided to permit interaction with the editor. A user may write scripts that perform automatic editing operations on windows that may act as a canvas for the model, and may permit user interaction with the model. A model may include one or more windows depending on whether the model is partitioned into multiple hierarchical levels.

Entity library 320 may include code modules or entities (e.g., blocks/icons) that a user can drag and drop into a display window that includes a graphical model. In the case of graphical models, a user may further couple entities using connections to produce a graphical model of a system, such as target environment 140.

Interface logic 330 may allow modeling system 120 to send or receive data and/or information to/from devices (e.g., target environment 140, processing cluster 150, etc.) or software modules (e.g., a function, an application program interface, etc.).

Compiler 340 may compile a model into an executable format. Compiled code produced by compiler 340 may be executed on computer device 110 to produce a modeling result. In an embodiment, compiler 340 may also provide debugging capabilities for diagnosing errors associated with the model. Compiler 340 may generate executable code for a part of a graphical model. The executable code may then be automatically executed during execution of the model, so that a first part of the model executes as an interpreted execution and a second part of the model executes as a compiled execution.

Controller logic 350 may be used to create and implement controllers in a graphical model. For example, controller logic 350 may provide functionality for entities that represent types of controllers in the graphical model. When the graphical model executes, controller logic 350 may perform control operations on the model by interacting with entities in the graphical model. In an embodiment, controller logic 350 may include control algorithms that implement controllers in the graphical model, such as, for example, 'proportional-integral-derivative' (PID) controls, gain scheduling controls, H-infinity controls, model predictive controls (MPC), dynamic inversion controls, bang/band controls, sliding mode controls, deadbeat controls, and/or other type of controls. Embodiments of controller logic 350 may be configured to operate in standalone or distributed implementations.

Optimizer 360 may optimize code, parameters, performance (e.g., execution speed, memory usage), etc., for a model. For example, optimizer 360 may optimize code to cause the code to occupy less memory, to cause the code to execute more efficiently, to cause the code to execute faster, etc., than the code would execute if the code were not optimized. Optimizer 360 may also perform optimizations for controller logic 350, e.g., to optimize parameters for a controller. In an embodiment, optimizer 360 may operate with or may be integrated into compiler 340, controller logic 350, code generator 390, etc. Embodiments of optimizer 360 may be implemented via software objects that interact with other object oriented software, e.g., for receiving data on which optimizer 360 operates.

Simulation engine 370 may perform operations for executing a model to simulate a system. Executing a model to simulate a system may be referred to as simulating a model. Simulation engine 370 may be configured to perform standalone or remote simulations based on user preferences or system preferences.

Report engine 380 may produce a report based on information in modeling system 120. For example, report engine 380 may produce a report indicating whether a controller satisfies design specifications, a report indicating whether a controller operates in a stable manner, a report indicating whether a model compiles properly, etc. Embodiments of report engine 380 can produce reports in an electronic format for display on output device 250, in a hardcopy format, and/or a format adapted for storage in a storage device.

Code generator 390 can generate code from a model. In an embodiment, code generator 390 may be configured to compile and link the generated code to produce an "in-memory executable" version of a model. The in-memory executable version of a model may be used, for example, to simulate, verify, trim, and/or linearize the model. In an embodiment, code generator 390 may receive code in a first format and may transform the code from the first format into a second format. In an embodiment, code generator 390 can generate source code, assembly language code, binary code, interface information, configuration information, performance information, task information, etc., from at least a portion of a model. For example, code generator 390 can generate C, C++, SystemC, Java, Structured Text, etc., code from the model.

Embodiments of code generator 390 can further generate Unified Modeling Language (UML) based representations and/or extensions from some or all of a graphical model (e.g., System Modeling Language (SysML), Extensible Markup Language (XML), Modeling and Analysis of Real Time and Embedded Systems (MARTE), Architecture Analysis and Design Language (AADL), Hardware Description Language (HDL), Automotive Open System Architecture (AUTOSAR), etc.). In an embodiment, optimizer 360 can interact with code generator 390 to generate code that is optimized according to a parameter (e.g., memory use, execution speed, multi-processing, etc.). Embodiments of modeling environments consistent with principles of the invention can further include components such as verification components, validation components, etc.

Although FIG. 3 shows exemplary components of modeling system 120, in other implementations, modeling system 120 may include fewer components, different components, differently arranged components, or additional components than depicted in FIG. 3. Additionally or alternatively, one or more components of modeling system 120 may perform one or more tasks described as being performed by one or more other components of modeling system 120.

Figure 4:
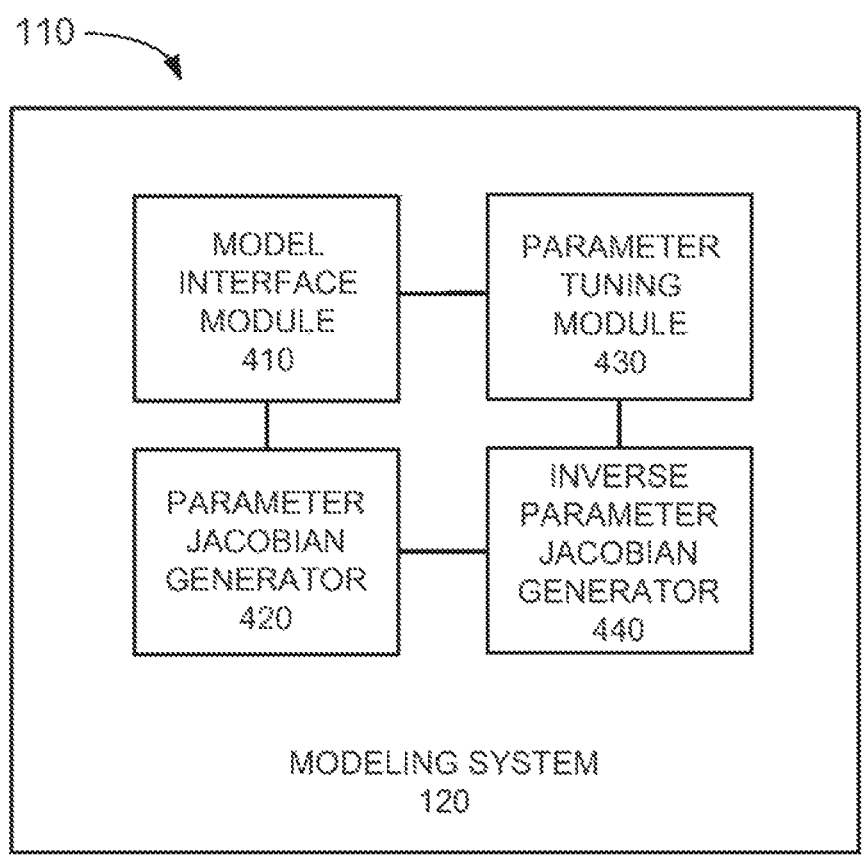
FIG. 4 is a diagram of exemplary functional components of the modeling system of FIG. 3.

FIG. 4 is a diagram of exemplary functional components of modeling system 120 that relate to parameter tuning. The functional components of modeling system 120 shown in FIG. 4 may be implemented, for example, as part of simulation tool 310 and/or any of the other components of modeling system 120 described above in connection with FIG. 3. Furthermore, the functional components of modeling system 120 shown in FIG. 4 may be implemented by processor 220 and memory 230 of computer device 110. Additionally or alternatively, some or all of the functional components of modeling system 120 shown in FIG. 4 may be implemented by hard-wired circuitry. As shown in FIG. 4, modeling system 120 may include a model interface module 410, a parameter Jacobian generator 420, a parameter tuning module 430, and an inverse parameter Jacobian generator 440.

Model interface module 410 may provide a framework to enable the user to select to tune one or more parameters associated with a graphical model. Model interface 410 may provide a plot resulting from a simulation of a graphical model to the user. The user may select to modify the plot by selecting one or more target points to define a target response (for example, by annotating one or more target points). Additionally or alternatively, the user may select to modify a property associated with the plot. For example, if the plot corresponds to a periodic plot, the user may select to modify an amplitude, a frequency, a damping constant, and/or another property associated with the periodic plot. Model interface module 410 may further present the user with a list of parameters associated with the graphical model and may enable the user to select one or more parameters to tune. Furthermore, model interface module 410 may enable the user to select to generate a source signal based on an inverse parameter Jacobian matrix associated with the graphical model.

Parameter Jacobian generator 420 may generate a parameter Jacobian matrix associated with a graphical model. For example, parameter Jacobian generator 420 may identify parameters associated with blocks in the graphical model. A parameter may be identified as a modifiable value associated with a block. For example, a constant block may generate a constant value and the constant value may be modifiable by the user. As another example, a gain block may multiply a signal by a gain value and the gain value may be modifiable by the user. As yet another example, a block may define a function that is applied to a signal and the function may include one or more parameters that may be modifiable. Parameter Jacobian generator 420 may remodel a block as a combination of a block with a state and a stateless block, wherein any parameters are associated with the stateless block. Parameter Jacobian generator 420 may further remodel the stateless block so that any parameters are included as inputs into the block. Parameter Jacobian generator 420 may then determine the block Jacobian matrix of the remodeled block and may obtain the parameter Jacobian as a sub-matrix of the block Jacobian matrix.

Parameter tuning module 430 may tune one or more parameters associated with the graphical model by determining adjustment values to the one or more parameters. The adjustment values may be determined by applying an inverse parameter Jacobian matrix to the selected one or more target response values. If the number of selected target response values equals the number of selected parameters to tune, parameter tuning module 430 may determine that a unique solution for the parameter tuning adjustment values exists, may determine the unique solution, and may present the unique solution of adjustment values to the user. If the number of selected target points is less than the number of selected parameters to tune, parameter tuning module 430 may determine that multiple solutions exist for the parameter tuning adjustment values and may select a solution based on one or more selection criteria (e.g., optimization criteria). If the number of selected target points is greater than the number of selected parameters to tune, parameter tuning module 430 may determine that no unique solution may exist for the parameter tuning adjustment values and parameter tuning module 430 may approximate a solution.

Inverse parameter Jacobian generator 440 may determine an inverse parameter Jacobian based on a parameter Jacobian matrix determined by parameter Jacobian generator 420. For example, inverse parameter Jacobian generator 440 may calculate an inverse of the parameter Jacobian matrix using Gaussian elimination, eigendecomposition, Cholesky decomposition, blockwise inversion, using a Neumann series, and/or using another technique for determining an inverse of a matrix.

Although FIG. 4 shows exemplary functional components of modeling system 120, in other implementations, modeling system 120 may include fewer functional components, different functional components, differently arranged functional components, or additional functional components than depicted in FIG. 4. Additionally or alternatively, one or more components of modeling system 120 may perform one or more tasks described as being performed by one or more other components of modeling system 120.

Figure 5:
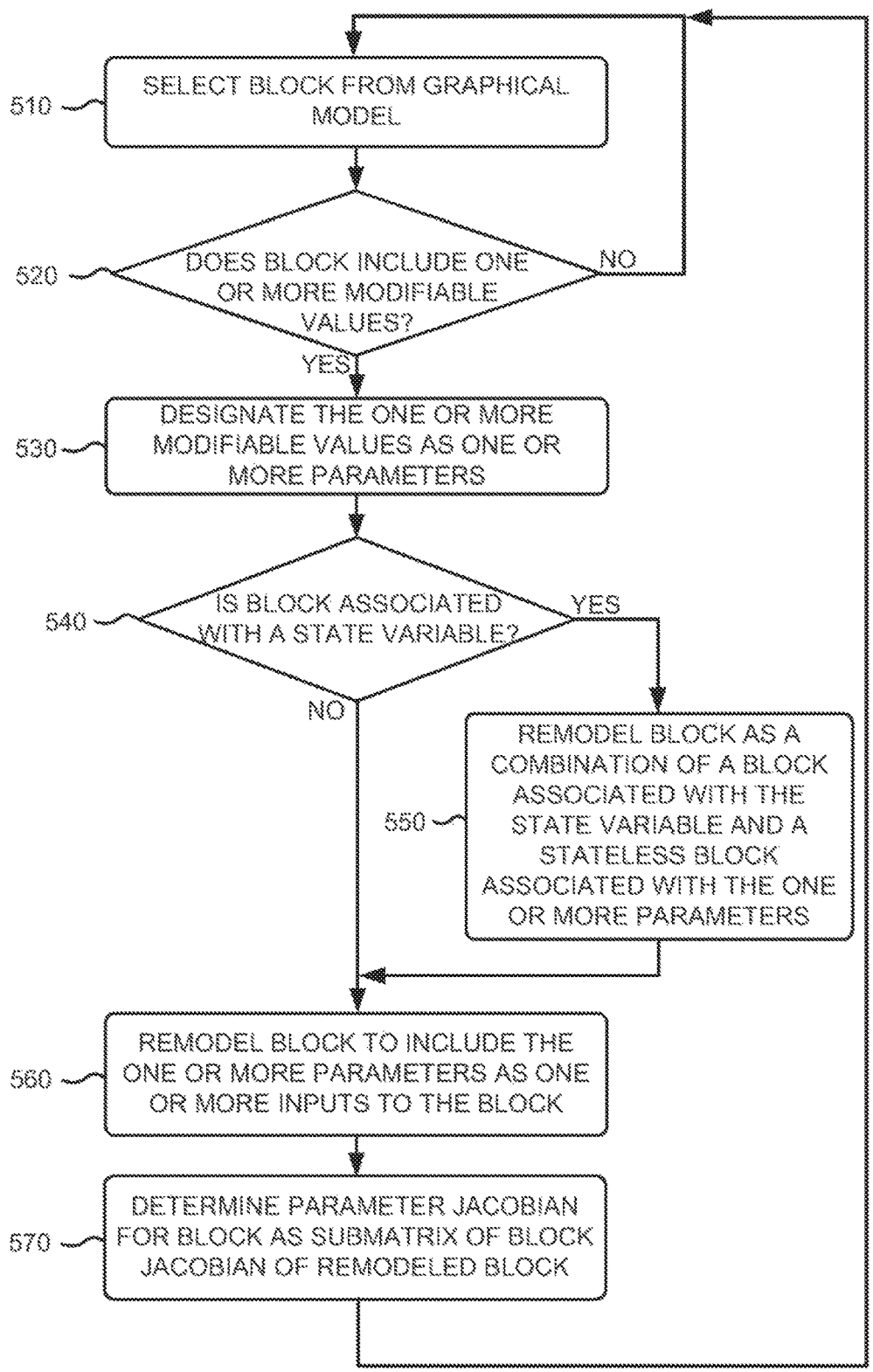
FIG. 5 is a flow diagram of an exemplary process for determining a parameter Jacobian matrix according to an implementation described herein.

FIG. 5 is a flow diagram of an exemplary process for determining a parameter Jacobian for a block according to an implementation described herein. For a constant block, the parameter Jacobian matrix may include one entry set to the value of 1, as explained above with reference to Equation (13). For a gain block, the parameter Jacobian matrix may include one entry set to the value of the input to the gain block, as explained above with reference to Equation (14). FIG. 5 describes a process for determining a parameter Jacobian matrix for other types of blocks. In one implementation, the process of FIG. 5 may be performed by computer device 110. In other implementations, some or all of the process of FIG. 5 may be performed by another device or a group of devices separate from computer device 110 and/or including computer device 110.

The process of FIG. 5 may include selecting a block from a graphical model (block 510). For example, parameter Jacobian generator 420 may analyze the blocks included in a graphical model and may select a particular block from the graphical model. A determination may be made as to whether the selected block includes one or more modifiable values (block 520). A modifiable value may be changed by the user by selecting to configure the block. For example, a function block may apply a particular function to an input and the function may include a modifiable value, such as a constant, a multiplying factor, a power factor, and/or another type of modifiable value. Parameter Jacobian generator 420 may determine whether a modifiable value is associated with the selected block.

If it is determined that the block does not include a modifiable value (block 520—NO), processing may return to block 510 to select another block from the graphical model. If it is determined that the block does include one or more modifiable values, the one or more modifiable values may be designated as one or more parameters (block 530). In some implementations, parameter Jacobian generator 420 may automatically designate any modifiable values associated with the selected block as parameters. In other implementations, parameter Jacobian generator 420 may prompt the user to select whether any of the modifiable values correspond to parameters that are of interest to the user. The user may select whether to designate any of the modifiable values as tunable parameters to be associated with the graphical model. In yet other implementations, parameter Jacobian generator 420 may automatically designate any modifiable values associated with the selected block as parameters if the modifiable values satisfy a particular criterion. For example, parameter Jacobian generator 420 may compare the modifiable values to a list of specified parameters that has been previously defined.

A determination may be made as to whether the selected block is associated with a state variable (block 540). For example, parameter Jacobian generator 420 may determine whether the block corresponds to a block that includes a state variable. Examples of blocks that may include a state variable are an integrator block, a derivative block, and/or a controller block. If it is determined that the block is associated with a state variable (block 540—YES), the block may be remodeled as a combination of a block associated with the state variable and a stateless block, where the designated one or more parameters are associated with the stateless block (block 550). For example, parameter Jacobian generator 420 may generate a subsystem block that includes a first block associated with the state variable and a second block, where the second block does not include a state variable and includes the designated one or more parameters. Remodeling the block as a combination of the first block and the second block may enable the parameters to be modeled without involving any state variable equations. Processing may continue to block 560. If it is determined that the block is not associated with a state variable (block 540—NO), processing may continue to block 560.

The block may be remodeled to include the designated one or more parameters as inputs to the block (block 560). For example, parameter Jacobian generator 420 may generate a virtual block that includes each of the designated one or more parameters as an input to the virtual block. A parameter Jacobian matrix for the block may be determined as a sub-matrix of the block Jacobian matrix associated with the remodeled block (block 570). For example, parameter Jacobian generator 420 may obtain a block Jacobian for the remodeled block. The block Jacobian may include the A, B, C, and D sub-matrices as explained above with reference to Equation (10). In some implementations, the block Jacobian may be generated by a solver used during a simulation of the graphical model. In other implementations, the block Jacobian may be generated by a component dedicated to generation of block Jacobian matrices for a graphical model. In yet other implementations, the block Jacobian matrix may be generated directly by parameter Jacobian generator 420. The parameter Jacobian matrix for the block may be extracted from the D sub-matrix of the block Jacobian, as explained above with reference to Equations (15) and (16).

Figure 6:
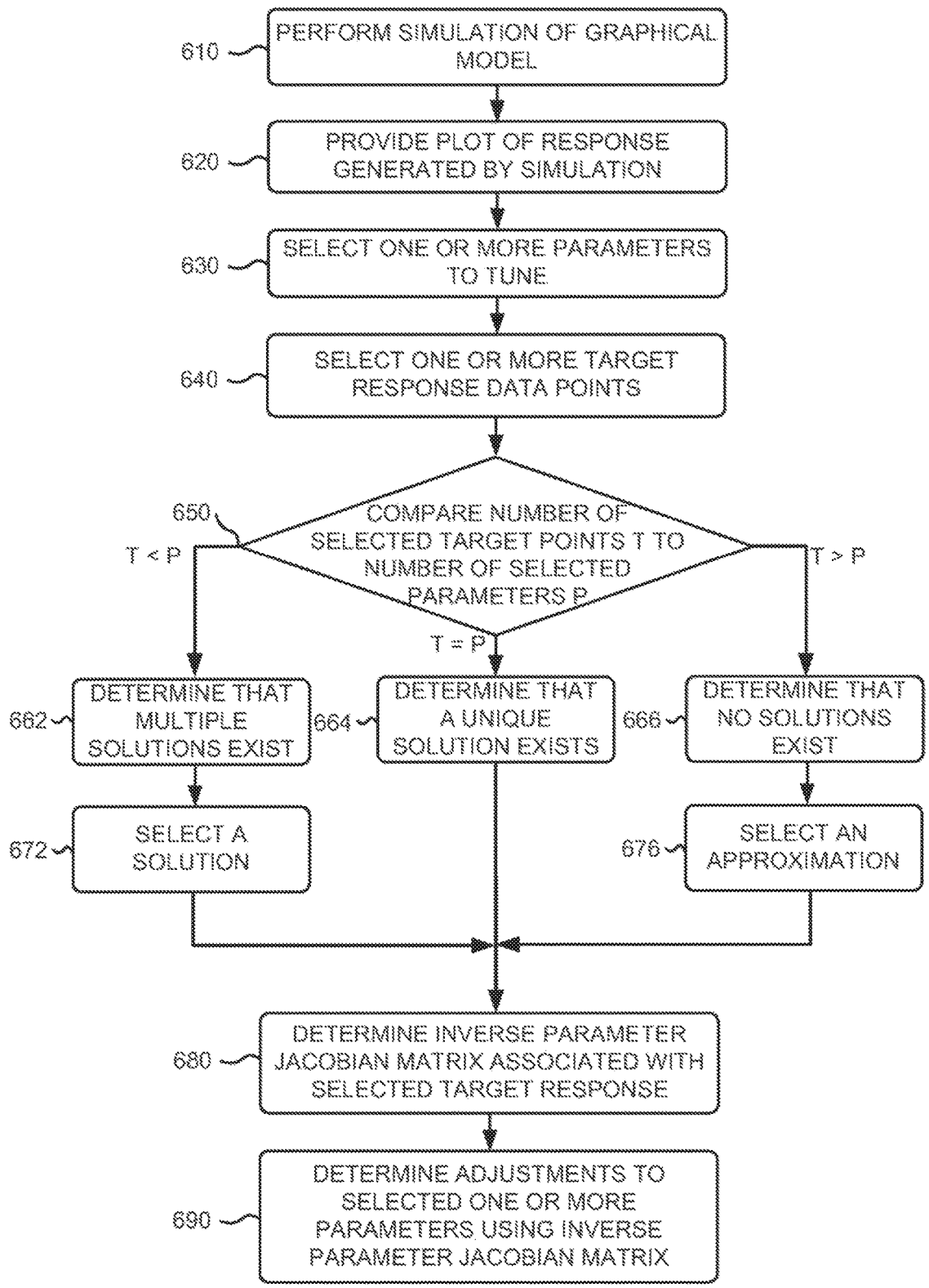
FIG. 6 is a flow diagram of an exemplary process for tuning a parameter associated with a graphical model according to an implementation described herein.

FIG. 6 is a flow diagram of an exemplary process for tuning a parameter associated with a graphical model according to an implementation described herein. In one implementation, the process of FIG. 6 may be performed by computer device 110. In other implementations, some or all of the process of FIG. 6 may be performed by another device or a group of devices separate from computer device 110 and/or including computer device 110.

The process of FIG. 6 may include performing a simulation of a graphical model (block 610) and providing a plot of a response generated by the simulation (block 620). For example, simulation tool 310 may perform a simulation of a graphical model using one or more solvers for a particular time interval, may generate a plot of the response of the graphical model (e.g., as a function of time, as a phase plot between two model variables, etc.), and may display the plot in a display window. For example, the graphical model may include a scope block that includes an output of the graphical model as an input and the generated plot may be associated with the scope block. A scope block may simulate an oscilloscope and may generate a plot of one or more outputs associated with the graphical model.

One or more parameters to tune may be selected (block 630). For example, model interface module 410 may provide a list of one or more parameters associated with the graphical model and the user may select one or more of the provided parameters to tune. One or more target response data points may be selected (block 640). For example, the user may select a target point a particular distance away from the generated plot at a particular time point. As another example, a user may enter a set of coordinates to define a target point (e.g., a time point value and a target response value associated with time point value). The user may continue to select target points to define a target response plot.

In some implementations, model interface module 410 may enable the user to select to modify one or more properties associated with a plot. As an example, a plot may correspond to a decaying curve and a user may select to modify a decay constant associated with the decaying curve. Model interface module 410 may generate a target response plot based on the selected decay constant and may select one or more target points on the generated target response plot. The number of selected target points may correspond to the number of selected parameters to tune in order to generate a square parameter Jacobian matrix that is invertible and corresponds to unique solution.

As another example, a plot may correspond to a periodic function and a user may select to modify a property associated with the periodic functions, such as a frequency and/or amplitude. Model interface module 410 may generate a target response plot based on the selected frequency and/or amplitude and may select one or more target points on the generated response plot. The number of selected target points may correspond to the number of selected parameters to tune in order to generate a square parameter Jacobian matrix that is invertible and corresponds to unique solution.

A comparison may be made between the selected number of target points T and the number of selected parameters P (block 650). For example, parameter tuning module 430 may compare the number of selected target response points T to the number of selected parameters to tune P.

If the number of selected target response points T is less than the selected number of parameters to tune P (block 650—"T<P"), a determination may be made that multiple solutions exist (block 662) and a solution may be selected (block 672). For example, if the number of selected target points is less than the number of selected parameters to tune, the parameter Jacobian matrix ($J_P$ in Equation (4)) may not correspond to a square matrix. Furthermore, since the number of selected target points is less than the number of selected parameters, multiple sets of parameter values may satisfy the constraints determined by the selected target points.

In some implementations, the multiple solutions may be computed and presented to the user. The user may then be provided with an option to select one of the presented solutions. For example, parameter tuning module 430 may select additional target points in order to generate a square parameter Jacobian matrix. The additional target points may be selected by extrapolating a curve generated by the selected target points. The extrapolation may be varied a particular number of times to generate a particular number of sets of target points. Each of the sets of target points may be associated with a solution that may be computed and presented to the user. Alternatively or additionally, the additional target points may be selected based on their temporal location, for example, with respect to the selected target points. The additional target points may be evenly spaced over a time interval as the values of the target response plot at those time points. The additional target points may be chosen in the temporal vicinity of the selected target points, for example, as a left and right bracket, with the values of the additional target points the values of the response plot at those time points.

In other implementations, parameter tuning module 430 may select a particular solution. For example, parameter tuning module 430 may either increase the number of target points to match the number of selected parameters or may decrease the number of parameters to tune to match the number of selected target points in order to define the particular solution. The particular solution may be selected based on one or more selection criteria, such as, for example, optimization criteria. The optimization criteria may include a cost function associated with the executable graphical model, a criteria specified by the user in connection with a request to tune the selected parameters, sensitivities associated with the selected parameters, and/or another criterion.

As an example, parameter tuning module 430 may select the solution, out of the multiple solutions, that minimizes a cost function associated with the graphical model. As another example, the user may specify a criterion, such a criterion that maximizes a particular output associated with the graphical model. As yet another example, parameter tuning module 430 may determine sensitivities associated with the selected parameters, may rank the selected parameters based on the determined sensitivities, and may select a subset of the selected parameters so that the number of parameters in the selected subset equals the number of selected target points. Assuming a system characterized by Equation (6), the sensitivity for a parameter may be determined by:

$$s(t, p) = \frac{\partial x}{\partial p}(t, p) \qquad \text{Equation (17)}$$

In Equation (17), s(t,p) corresponds to the sensitivity of parameter p at time t, and x may correspond to a state variable associated with the system equation characterized by Equation (6). Thus, the sensitivity of a parameter may be based on a value of a partial derivative of the parameter with respect to a system equation at a particular time value (e.g., a time value associated with one of the selected target response points). Processing may continue to determine an inverse parameter Jacobian matrix (block 680). As another example, the parameter sensitivity for a parameter may be determined based on the entries associated with the parameter in the parameter Jacobian matrix, since the parameter Jacobian matrix includes information about the range of change of the outputs associated with the graphical model with respect to the parameters.

Returning to block 650, if the number of selected target response points T equals the selected number of parameters to tune P (block 650—"T=P"), a determination may be made that a unique solution exists (block 664) and processing may continue to determine an inverse parameter Jacobian matrix (block 680). For example, if the number of selected target points equals the selected number of parameters to tune, the parameter Jacobian matrix ($J_P$ in Equation (4)) may correspond to a square matrix that is invertible. Consequently, a unique solution to Equation (5) may exist. Therefore, processing may continue to determine the inverse parameter Jacobian matrix (block 680).

If the number of selected target response points T is greater than the selected number of parameters to tune P (block 650—"T>P"), a determination may be made that no solution exists (block 666) and an approximation may be selected (block 676).

For example, if the number of selected target points is greater than the number of selected parameters to tune, the parameter Jacobian matrix ($J_P$ in Equation (4)) may not correspond to a square matrix and may therefore not be invertible. Furthermore, since the number of selected target points is greater than the number of selected parameters, there may not be enough selected parameters to satisfy the constraints determined by the selected target points. Therefore, parameter tuning module 430 may approximate a solution. A solution may be approximated by either increasing the number of parameters to tune or by selecting another set of target points such that the number of target points equals the number of selected parameters to tune. For example, the other set of target points may be selected so that a curve defined by the other set of target points optimally approximates a curve defined by the target points selected by the user. In some implementations, the optimal approximation may be determined using a linear regression technique. In other implementations, another type of approximation technique may be used. For example, if different variables (e.g., outputs, parameters, etc.) are associated with different error tolerances, a weighted least squares approximation technique may be used. Processing may continue to determine an inverse parameter Jacobian matrix (block 680).

As an alternative approximation, the change in parameters can be chosen such that they minimize a cost function over the difference between the selected target points and the actually achievable target points. Because they are less selected parameters than target points, the cost function may not be reduced to zero, but a cost function with a lower cost may indicate a better solution over another cost function with a higher cost. As yet another alternative, the user may designate particular ones of the selected target points with an importance rating. For example, the user may select to designate a first target point as having a high importance and may select to designate a second target point as having a low importance. Parameter tuning module 430 may give more weight to the first target point when performing a parameter tuning. Thus, if there are more selected target points than selected parameters, selected target points with a lower importance rating may be disregarded to approach a situation where the number of target points equals the number of selected parameters to tune.

While in some implementations, as described above, the number of target response points or the number of parameters to tune may be increased or decreased in order to generate a square parameter Jacobian matrix, in other implementations, a matrix pseudoinverse may be generated for a non-square parameter Jacobian matrix in order to determine the adjustment values ΔP for the selected parameters to tune using the selected target response points. As an example, inverse parameter Jacobian generator 440 may determine a one-sided inverse (e.g., a left inverse or right inverse). As another example, inverse parameter Jacobian generator 440 may determine a Moore-Penrose pseudoinverse as an inverse for the non-square parameter Jacobian matrix.

An inverse parameter Jacobian matrix associated with the selected target response may be determined (block 680). For example, inverse parameter Jacobian generator 440 may determine an inverse parameter Jacobian based on a parameter Jacobian matrix associated with the graphical model. Inverse parameter Jacobian generator 440 may calculate an inverse of the parameter Jacobian matrix using Gaussian elimination, eigendecomposition, Cholesky decomposition, blockwise inversion, using a Neumann series, and/or using another technique for determining an inverse of a matrix.

Adjustments to the selected one or more parameters may be determined using the inverse parameter Jacobian matrix (block 690). For example, parameter tuning module 430 may use Equation (5) to determine the adjustments to the selected parameters ΔP using the inverse parameter Jacobian matrix $J_P^{-1}$. The determined adjustments may be presented to the user. As an example, a window may be presented with the determined adjustment values. The presentation of the determined adjustment values to the values of the selected parameters may be actively linked (e.g., hyperlinked) to an element in a corresponding graphical model (e.g., a blocks that are associated with the parameters). As another example, the determined adjustments to the values of the selected parameters may be presented to the user on a graphical model in connection with the blocks associated with the parameters (e.g., a tooltip may be presented, pointing to the block, with the adjustment value displayed within the tooltip).

Figure 7:
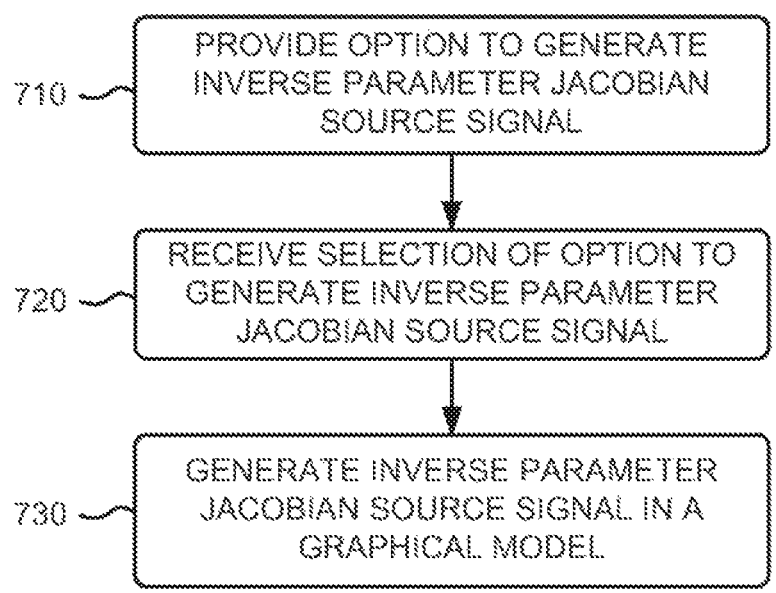
FIG. 7 is a flow diagram of an exemplary process for generating an inverse parameter Jacobian source signal according to an implementation described herein.

FIG. 7 is a flow diagram of an exemplary process for generating an inverse parameter Jacobian parameter source signal according to an implementation described herein. An inverse parameter Jacobian matrix source signal may be useful during a simulation to determine how a response of a graphical model relates to a particular behavior profile. As an example, the user may define a safety margin that varies over time and the inverse parameter Jacobian matrix source signal may be compared with the safety margin to determine how close the response of the graphical model is to the defined safety margin at particular time steps during a simulation. As another example, one or more parameters may be allowed to vary during a simulation (e.g., as a result of another source signal). An acceptable range may be defined for the varying parameters and the inverse parameter Jacobian matrix source signal may be used to determine whether a parameter is outside the acceptable range. Thus, the inverse parameter Jacobian matrix source signal may be used for fault detection.

In one implementation, the process of FIG. 7 may be performed by computer device 110. In other implementations, some or all of the process of FIG. 7 may be performed by another device or a group of devices separate from computer device 110 and/or including computer device 110.

The process of FIG. 7 may include providing an option to generate an inverse parameter Jacobian source signal (block 710). For example, model interface module 410 may provide an option, associated with a Jacobian scope block, to generate an output signal from the Jacobian scope block that provides an inverse parameter Jacobian matrix signal at particular time steps during a simulation. The user may be given an option to select which parameters are to be included in determining the inverse parameter Jacobian matrix signal. As another example, model interface module 410 may provide an option, associated with a block in a graphical model to generate an output signal that provides an inverse parameter Jacobian matrix signal at particular times during a simulation. The output signal may be related to a parameter that is associated with the block.

A selection of an option to generate an inverse parameter Jacobian source signal may be received (block 720). For example, a user may select to generate an inverse parameter Jacobian signal. Modeling system 120 may generate an output signal from the scope block and the user may generate a connection from the output signal of the scope block to another block in the graphical model.

The inverse parameter Jacobian source signal may be generated in a graphical model (block 730). For example, during a simulation of the graphical model, simulation tool 310 may, via inverse parameter Jacobian generator 440, generate an inverse parameter Jacobian matrix signal at particular time points during the simulation. The inverse parameter Jacobian matrix source signal may be used as an input signal to another block that may use the signal to perform one or more tasks. For example, the other block may determine a difference vector between the inverse parameter Jacobian matrix source signal and another source signal.

Figure 8:
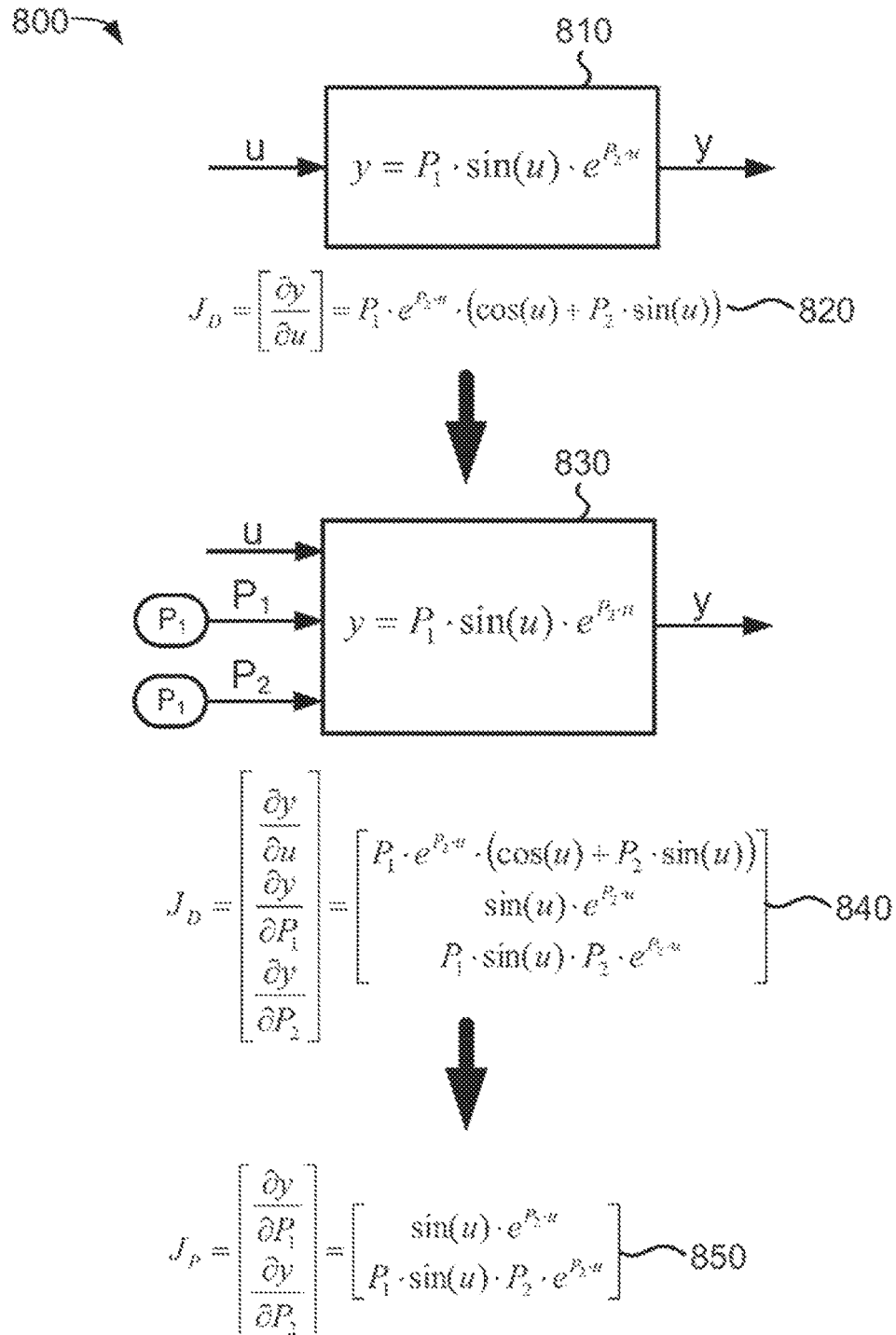
FIG. 8 is an example of a block and an associated parameter Jacobian matrix according to an implementation described herein.

FIG. 8 is an example 800 of a block and an associated parameter Jacobian matrix according to an implementation described herein in accordance with the process described above with reference to FIG. 5. Example 800 includes block 810, which applies a user-defined function $y=P_1 \cdot \sin(u) \cdot e^{P_2 \cdot u}$ to an input u and generates an output y. Block 810 may include two modifiable values, $P_1$ and $P_2$. Modifiable values $P_1$ and $P_2$ may be designated as tunable parameters.

Block 810 may be associated with a block Jacobian that may include sub-matrix D 820:

$$J_D = \left[\frac{\partial y}{\partial u}\right] = P_1 \cdot e^{P_2 \cdot u} \cdot (\cos(u) + P_2 \cdot \sin(u)) \qquad \text{Equation (18)}$$

A parameter Jacobian matrix includes the partial derivatives of block outputs with respect to block parameters, which may provide information about the rate of change of a particular output with respect to the rate of change of a particular parameter. As shown in FIG. 8 and Equation (17), sub-matrix D 820 of block 810 may not provide information about the rate of change of the parameters of interest. Therefore, block 810 may be remodeled as a replacement block 830 that includes $P_1$ and $P_2$ as inputs to virtual block 830 (as explained above with reference to FIG. 5). Virtual block 830 may be associated with sub-matrix D 840:

$$J_D = \begin{bmatrix} \frac{\partial y}{\partial u} \\ \frac{\partial y}{\partial P_1} \\ \frac{\partial y}{\partial P_2} \end{bmatrix} = \begin{bmatrix} P_1 \cdot e^{P_2 \cdot u} \cdot (\cos(u) + P_2 \cdot \sin(u)) \\ \sin(u) \cdot e^{P_2 \cdot u} \\ P_1 \cdot \sin(u) \cdot P_2 \cdot e^{P_2 \cdot u} \end{bmatrix} \quad \text{Equation (19)}$$

As shown in FIG. 8 and in Equation (18), sub-matrix D 840 of the remodeled virtual block includes the partial derivative of y with respect to $P_1$ and the partial derivative of y with respect to $P_2$. These two components of sub-matrix D 840 correspond to the parameter Jacobian matrix 850 of block 810:

$$J_P = \begin{bmatrix} \frac{\partial y}{\partial P_1} \\ \frac{\partial y}{\partial P_2} \end{bmatrix} = \begin{bmatrix} \sin(u) \cdot e^{P_2 \cdot u} \\ P_1 \cdot \sin(u) \cdot P_2 \cdot e^{P_2 \cdot u} \end{bmatrix} \quad \text{Equation (20)}$$

Thus, the parameter Jacobian matrix of a block may be obtained by remodeling the block with the parameters of interest being included as inputs to the block.

Figure 9A:
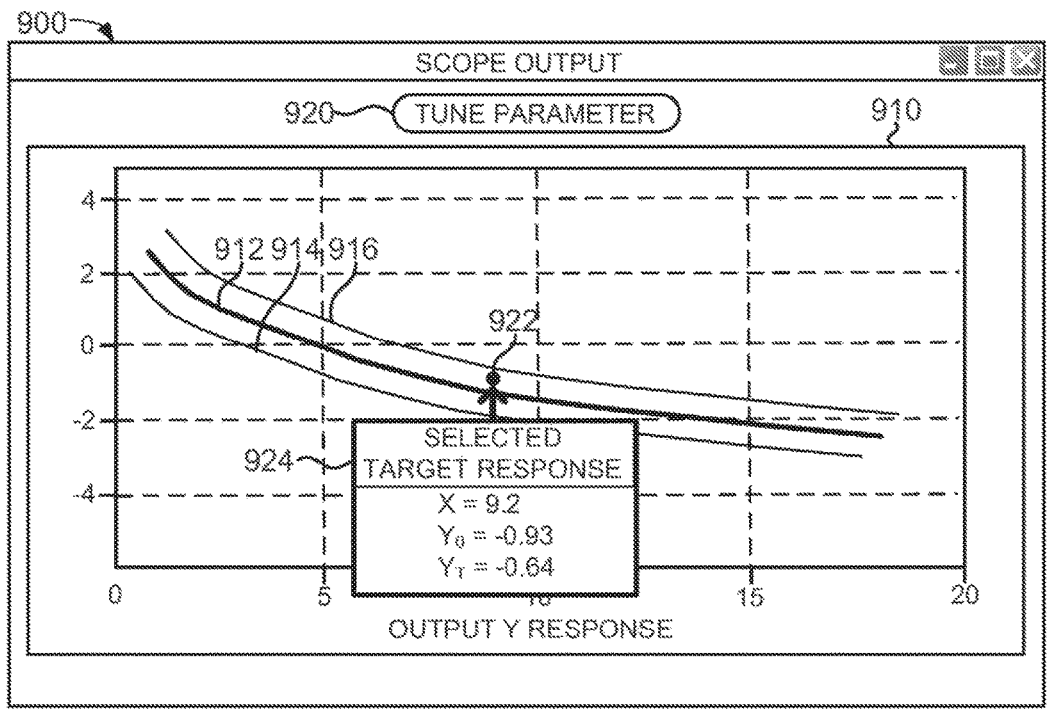
FIGS. 9A-9B are exemplary user interfaces for tuning a parameter according to an implementation described herein.
Figure 9B:
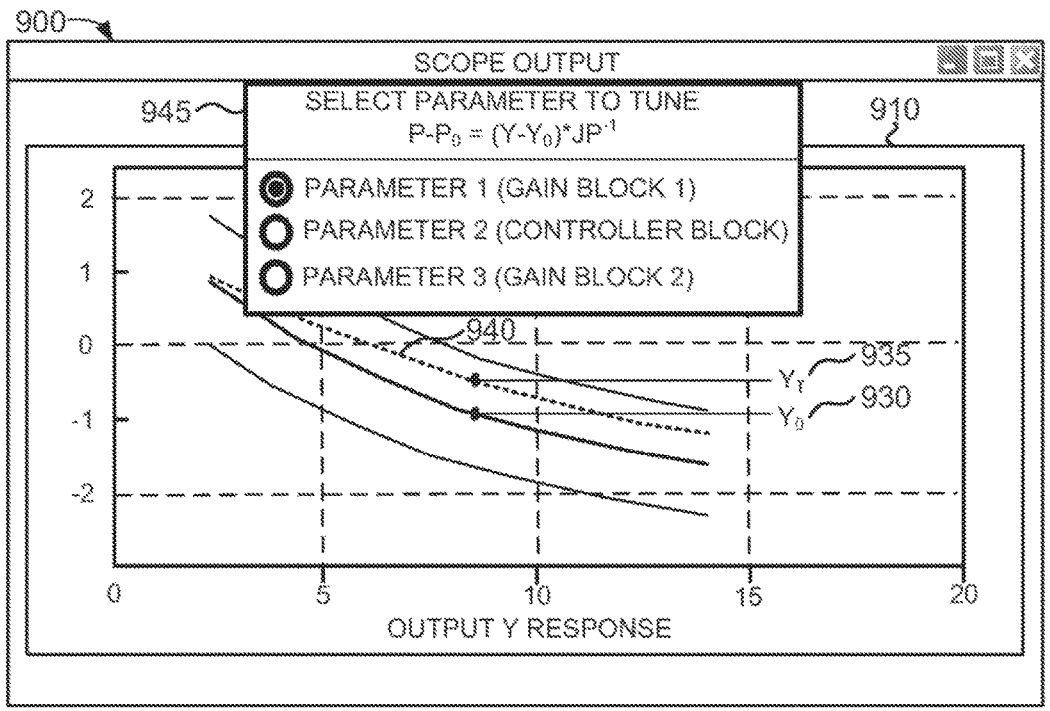

FIGS. 9A-9B illustrate exemplary user interface 900 that may enable a user to select to tune a parameter according to an implementation described herein in accordance to the process described above with reference to FIG. 6. User interface 900 may correspond to the output of a scope block that receives an output signal from a graphical model. The scope may generate a plot 910 that plots the output signal as a function of time based on a simulation of the graphical model. Plot 910 may include a lower bound curve 914 and an upper bound curve 916. Lower bound curve 914 and upper bound curve 916 may define the lower bound and the upper bound, respectively, for the system response based on one or more constraints associated with the graphical model. The user may activate a parameter tuning function by selecting a tune parameter selection object 920. Subsequently, the user may select a target response 922 by clicking on a point on plot 910. A target response point box 924 may appear that may include information about the selected target response point, such as the corresponding time point value, the generated response $y_0$ 930, and the selected target response $y_T$ 935.

FIG. 9B illustrates a target response curve 940 that may be generated in response to the user selecting target response $y_T$ 935. Subsequently, the user may indicate that the user has finished selecting target response points and parameter tuning selection box 940 may be presented to the user to select one or more parameters to tune. In some implementations, target response curve 940 may be presented based on a live interaction with the plot. For example, a user may drag a mouse pointer to move a vertical line on plot 910, where the vertical line may represent a point in time. In response to the user moving the vertical line, target response curve 940 may change. In a situation where a plot shows multiple target responses, corresponding to multiple model outputs, multiple target response may change as the user moves the vertical line.

Figure 10A:
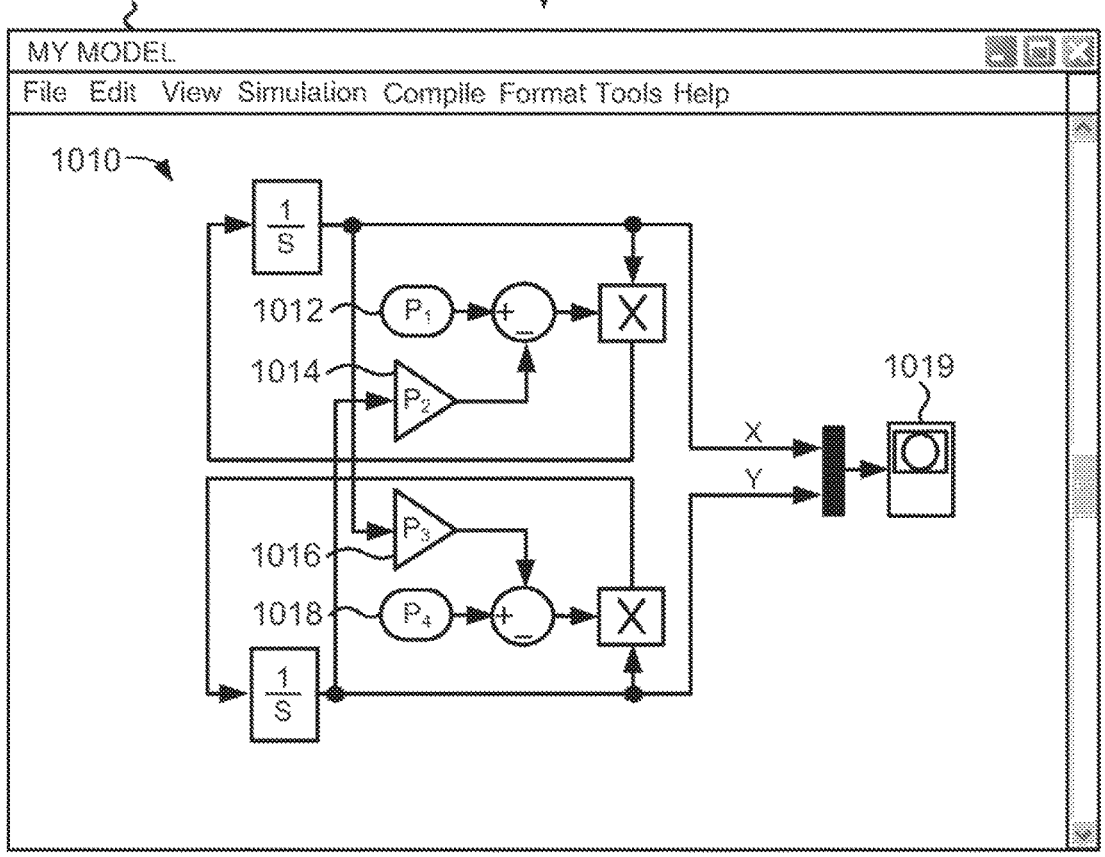
FIGS. 10A-10G illustrate examples of parameter tuning according to an implementation described herein.

FIGS. 10A-10G illustrate an example of parameter tuning according to an implementation described herein. FIG. 10A illustrates differential equations 1001 that may characterize a dynamic system. Differential equations 1001 may be used, for example, to describe predator-prey interactions in an ecosystem, interactions between two industrial sectors in an economy, interactions between reagents in autocatalytic chemical reactions, and/or interactions in another type of system. User interface 1002 includes a graphical model 1010 that may be used to represent differential equations 1001. Graphical model 1010 may include a first parameter $P_1$ 1012, a second parameter $P_2$ 1014, a third parameter $P_3$ 1016, and a fourth parameter $P_4$ 1018. Graphical model 1010 may include a scope block 1019 that may display outputs X and Y during a simulation.

Figures 10B, 10C:
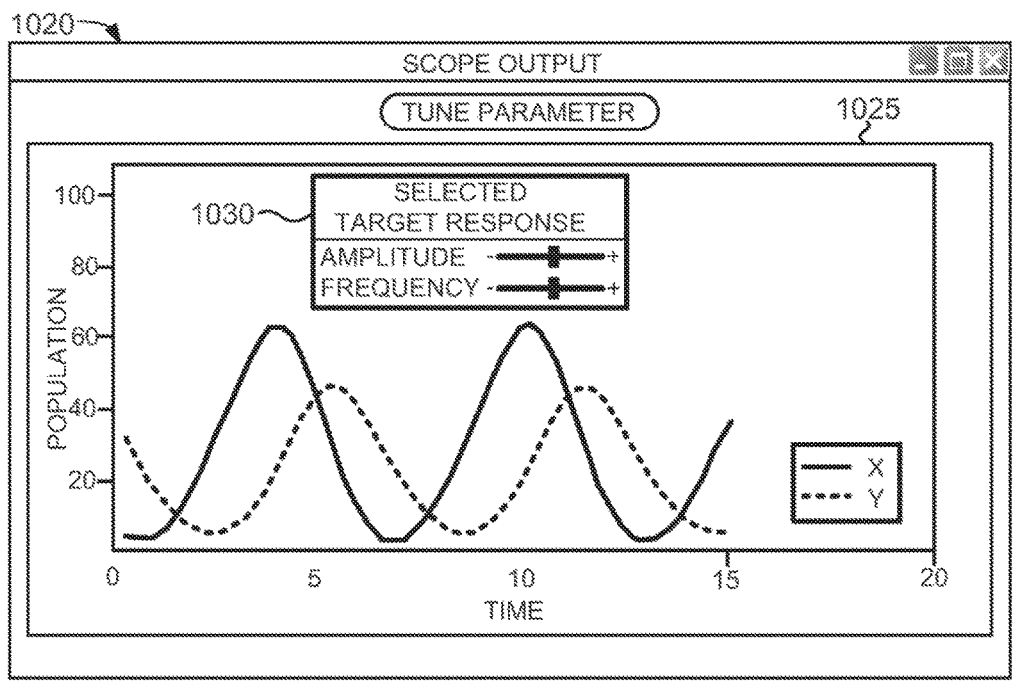

FIG. 10B illustrates a user interface 1020 that may display a response plot 1025 associated with scope block 1019. The user may select to tune the parameters associated with graphical model 1010 and a target response selection box 1030 may appear. Since response plot 1025 corresponds to a periodic response, target response selection box 1030 may enable a user to select to specify a particular amplitude and/or frequency for response plot 1025. Assume that two target points are required to define a selected amplitude and frequency.

FIG. 10C illustrates a parameter selection process 1040. Parameter selection process 1040 may include determining a parameter Jacobian matrix 1040 associated with graphical model 1010 and determining a parameter ranking 1044 based on parameter sensitivity. As shown in parameter Jacobian matrix 1040, parameters $P_1$ and $P_4$ may be associated with a higher sensitivity than parameters $P_2$ and $P_3$. Thus, parameters $P_1$ and $P_4$ may be selected to be tuned.

Figure 10D:
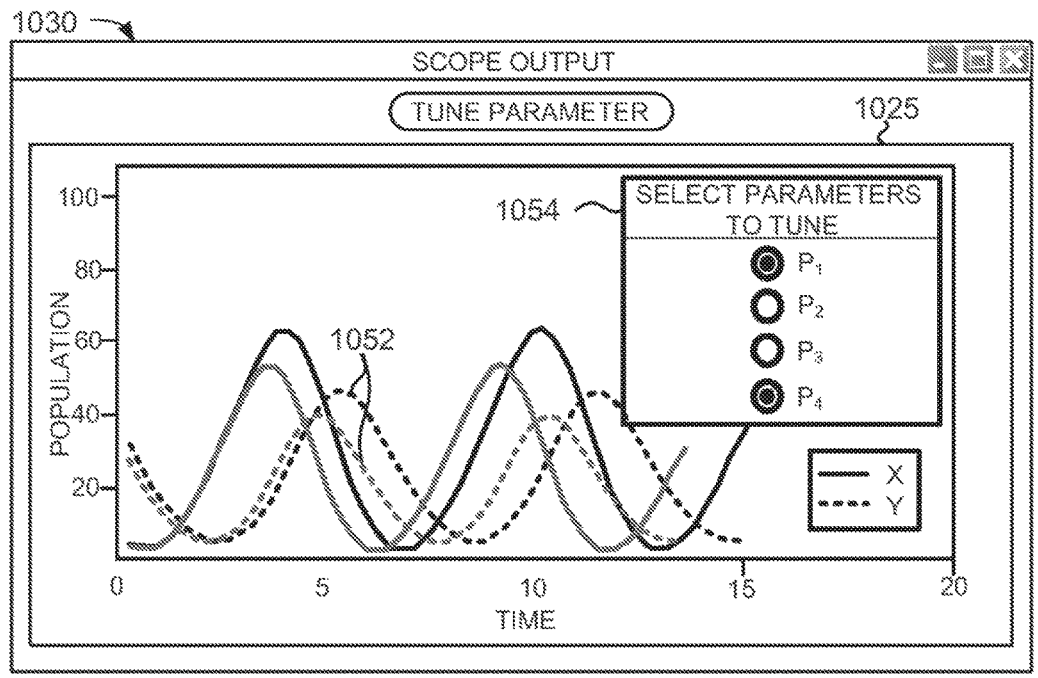

FIG. 10D illustrates user interface 1025 with a target response 1052 that corresponds to the user's selected amplitude and frequency. User interface 1025 may also include parameter selection box 1054 that may be presented to the user after the user has selected the target response. Parameter selection box 1054 may include a pre-selected set of parameters to tune based on the determined parameter selection process 1040. Assume the user accepts to tune the suggested parameters $P_1$ and $P_4$ that were selected based on parameter sensitivity.

After parameters $P_1$ and $P_4$ are selected, inverse parameter Jacobian generator 440 may determine the inverse parameter Jacobian matrix based on selected parameters $P_1$ and $P_4$ and based on target response 1052. The inverse parameter Jacobian matrix may be used to determine adjustment values for $P_1$ and $P_4$, which may result in values for $P_1$ and $P_4$ that will generate target response 1052.

Figure 10E:
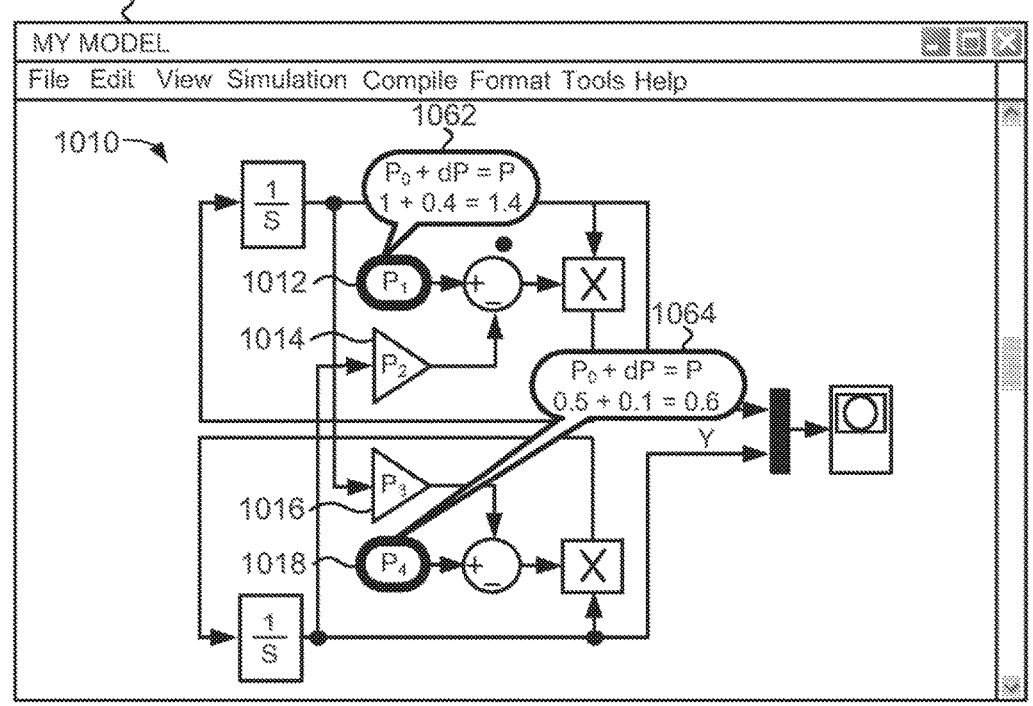

FIG. 10E illustrates user interface 1002 after the parameter tuning process has been performed. User interface 1002 may include graphical model 1010 along with a tooltip 1062 and a tooltip 1064. Tooltip 1062 may display the current value for $P_1$, the determined adjusted value, and the new value for $P_1$ after the adjustment. Tooltip 1064 may display the current value for $P_4$, the determined adjusted value, and the new value for $P_4$ after the adjustment.

Figure 10F:
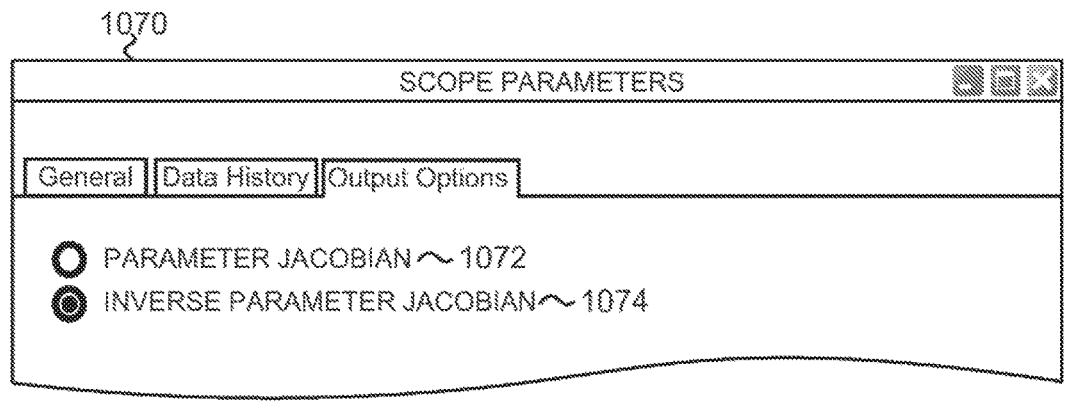

FIG. 10F illustrates a user interface 1070 that may be associated with scope block 1019. User interface 1070 may include a selection object to select a parameter Jacobian source signal radio button 1072 and/or an inverse parameter Jacobian source signal radio button 1074. Assume the user select inverse parameter Jacobian source signal radio button 1074. In response to the selection, an inverse parameter Jacobian source signal may be generated originating at scope block 1019.

Figure 10G:
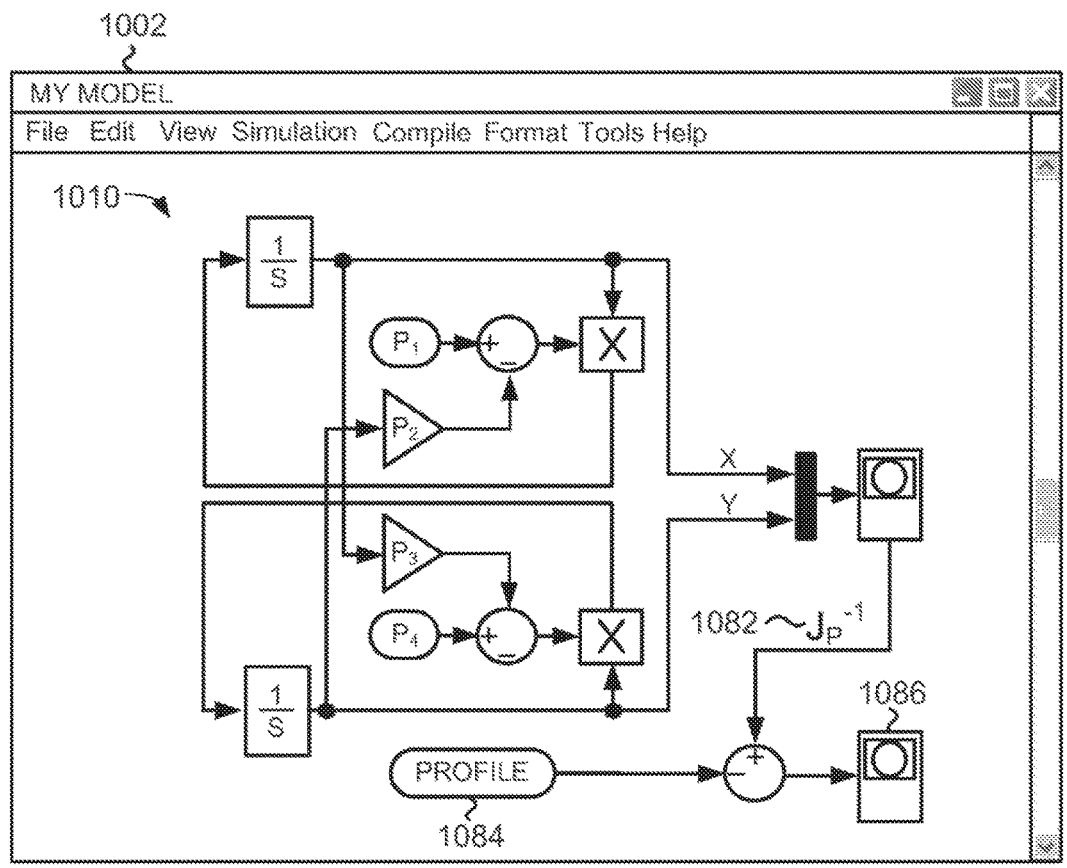

FIG. 10G illustrates user interface 1002 that includes graphical model 1010 with a connection 1082 that may provide the inverse parameter Jacobian source signal to a sum block. The sum block may difference the inverse parameter Jacobian source signal with a signal from a source block 1084 and may display the result via scope block 1086. Source block 1084 may, for example, provide a profile that may indicate a maximum allowable variability of the parameters and scope block 1086 may display how closely the system response approaches the profile.

The foregoing description provides illustration and description, but is not intended to be exhaustive or to limit the implementations to the precise form disclosed. Modifications and variations are possible in light of the above teachings or may be acquired from practice of the described implementations.

For example, while series of blocks have been described with respect to FIGS. 5-7, the order of the blocks may be modified in other implementations. Further, non-dependent blocks may be performed in parallel.

Furthermore, while exemplary processes and/or examples may have been described with respect to a single response plot or a single output for illustrative purposes, the systems and methods described herein may be used with multiple outputs or response plots.

Also, certain portions of the implementations may have been described as a "component," "logic," "generator," "module," and/or "system" that performs one or more functions. The described "component," "logic," "generator," "module," and/or "system" may include hardware, such as a processor, an ASIC, or a FPGA, or a combination of hardware and software (e.g., software running on a processor).

It will be apparent that aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Even though particular combinations of features are recited in the claims and/or disclosed in the specification, these combinations are not intended to limit the disclosure of the implementations. Although each dependent claim listed below may directly depend on only one other claim, the disclosure of the implementations includes each dependent claim in combination with every other claim in the claim set.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

What is claimed is:

1. A method performed by a computer device, the method comprising:
   interacting with one or more plots associated with a simulation of an executable graphical model,
      the one or more plots being graphically displayed, and
      the interacting being performed by the computer device;
   detecting a selection of one or more target output points associated with the one or more plots based on a user interaction with a point on the graphically displayed one or more plots,
      where the point is located within a particular distance from plotted data of the one or more plots, and
      the detecting of the selection of the one or more target output points being performed by the computer device;
   providing, via a graphical user interface, one or more system parameters, associated with the executable model, that are tunable,
      the providing the one or more system parameters being performed by the computer device;
   detecting a selection identifying one or more parameters, associated with the one or more plots, of the one or more system parameters,
      the detecting the selection identifying the one or more parameters being performed by the computer device;
   generating a parameter sensitivity for the one or more parameters,
      the generating being performed by the computer device;
   determining one or more tuning values for the one or more parameters based on the parameter sensitivity and based on the selected one or more target output points,
      the determining being performed by the computer device; and
   providing other plotted data, generated based on the one or more tuning values and the selected one or more target output points, for display via the graphical user interface,
      the providing the other plotted data being performed by the computer device.

2. The method of claim 1, where the parameter sensitivity is generated based on an inverse parameter Jacobian matrix,
   where the inverse parameter Jacobian matrix corresponds to an inverse of a parameter Jacobian matrix associated with the executable graphical model,
   where the parameter Jacobian matrix relates one or more partial derivatives of the one or more system parameters, associated with the executable graphical model, to one or more system equations, associated with the executable graphical model; and
   where generating the inverse parameter Jacobian matrix includes:
      determining the one or more system parameters associated with the executable graphical model;
      determining the one or more partial derivatives of the one or more system parameters with respect to the one or more system equations;
      determining the parameter Jacobian matrix based on the one or more partial derivatives; and
      inverting the parameter Jacobian matrix to generate the inverse parameter Jacobian matrix.

3. The method of claim 2, further comprising:
   providing an option to generate a source signal based on the inverse parameter Jacobian matrix;
   receiving a selection of the option; and
   generating the source signal in the executable graphical model, when the selection of the option is received.

4. The method of claim 3, further comprising:
providing, via the generated source signal, one or more values associated with the inverse parameter Jacobian matrix at a particular time step during the simulation of the executable graphical model.

5. The method of claim 1, further comprising:
determining that a quantity of the selected one or more target output points equals a quantity of the one or more parameters;
determining that a unique solution exists to the one or more tuning values for the one or more parameters, based on determining that the quantity of the selected one or more target output points equals the quantity of the one or more parameters; and
providing the one or more tuning values for the one or more parameters as the determined unique solution.

6. The method of claim 1, further comprising:
determining that a quantity of the selected one or more target output points is less than a quantity of the one or more parameters; and
determining that more than one solution, to the one or more tuning values for the one or more parameters, exists based on determining that the quantity of the selected one or more target output points is less than the quantity of the one or more parameters.

7. The method of claim 6, where providing the one or more tuning values includes providing at least a subset of the more than one solution to a user; and
where the method further comprises:
receiving a selection of one or more solutions, from the at least a subset of the more than one solution, from the user.

8. The method of claim 6, further comprising:
selecting one of the more than one solution based on one or more optimization criteria.

9. The method of claim 8, where the one or more optimization criteria include:
one or more cost functions associated with the executable graphical model; or
a criterion specified by a user in connection with a request to determine the one or more tuning values for the one or more parameters.

10. The method of claim 8,
where the selecting the one of the more than one solution based on the one or more optimization criteria includes:
determining sensitivities associated with particular ones of the one or more parameters;
ranking the one or more parameters based on the determined sensitivities;
selecting top n parameters from the ranked one or more parameters,
n corresponding to a quantity of the selected one or more target output points; and
generating an inverse parameter Jacobian matrix based on the selected top n parameters,
the one or more tuning values being determined based on the inverse parameter Jacobian matrix.

11. The method of claim 10, where a sensitivity associated with a particular one of the one or more parameters is based on a value of a partial derivative of the particular one of the one or more parameters with respect to one or more system equations at a time value associated with the selected one or more target output points.

12. The method of claim 1, further comprising:
determining that a quantity of the selected one or more target output points is greater than a quantity of the one or more parameters;
determining that no solution, to the one or more tuning values for the one or more parameters, exists based on determining that the quantity of the selected one or more target output points is greater than the quantity of the one or more parameters;
computing an approximation to the one or more plots, when no solution exists to the one or more tuning values for the one or more parameters,
where the approximation includes a quantity of target output points equal to the quantity of the one or more parameters; and
determining the one or more tuning values for the one or more parameters based on the approximation.

13. The method of claim 12, where a first one of the one or more target output points is associated with an importance rating higher than a threshold rating and a second one of the one or more target output points is associated with an importance rating lower than the threshold rating, and
where the computing the approximation to the one or more plots includes:
disregarding the second one of the one or more target output points.

14. The method of claim 1,
where the point is located within a tolerance limit associated with the plotted data.

15. The method of claim 1, further comprising:
providing an indication of one of the determined one or more tuning values, associated with a particular parameter of the one or more parameters, in connection with a block associated with the particular parameter.

16. The method of claim 1, where the parameter sensitivity is generated based on an inverse parameter Jacobian matrix,
where the inverse parameter Jacobian matrix corresponds to an inverse of a parameter Jacobian matrix associated with the executable graphical model, and
where the parameter Jacobian matrix relates one or more partial derivatives of the one or more system parameters, associated with the executable graphical model, to one or more system equations, associated with the executable graphical model.

17. The method of claim 1, further comprising:
providing the executable graphical model for display via the graphical user interface,
the one or more tuning values being actively linked to an element of the executable graphical model in the graphical user interface, and
the providing the executable graphical model being performed by the computer device.

18. A non-transitory computer-readable medium storing instructions, the instructions comprising:
one or more instructions which, when executed by at least one processor, cause the at least one processor to:
interact with one or more plots associated with a simulation of an executable graphical model,
the one or more plots being graphically displayed;
detect a selection of one or more target output points associated with the one or more plots based on a user interaction with a point on the graphically displayed one or more plots,
where the point is located within a particular distance from plotted data of the one or more plots;
provide, via a graphical user interface, one or more system parameters, associated with the executable graphical model, that are tunable;

detect a selection identifying one or more parameters, associated with the one or more plots, of the one or more system parameters;
generate a parameter sensitivity for the one or more parameters;
determine one or more tuning values for the one or more parameters based on the parameter sensitivity and based on the selected one or more target output points; and
provide other plotted data, generated based on the one or more tuning values and the selected one or more target output points, for display via the graphical user interface.

19. The non-transitory computer-readable medium of claim 18, where the parameter sensitivity is generated based on an inverse parameter Jacobian matrix,
where the inverse parameter Jacobian matrix corresponds to an inverse of a parameter Jacobian matrix associated with the executable graphical model, and
where the parameter Jacobian matrix relates one or more partial derivatives of the one or more system parameters, associated with the executable graphical model, to one or more system equations, associated with the executable graphical model;
where the one or more instructions to determine the inverse parameter Jacobian matrix include:
one or more instructions to determine the one or more system parameters associated with the executable graphical model;
one or more instructions to determine the one or more partial derivatives of the one or more system parameters with respect to the one or more system equations;
one or more instructions to determine the parameter Jacobian matrix based on the one or more partial derivatives; and
one or more instructions to invert the parameter Jacobian matrix to generate the inverse parameter Jacobian matrix.

20. The non-transitory computer-readable medium of claim 19, the instructions further comprising:
one or more instructions to provide an option to generate a source signal based on the inverse parameter Jacobian matrix;
one or more instructions to receive a selection of the option; and
one or more instructions to generate the source signal in the executable graphical model, when the selection of the option is received.

21. The non-transitory computer-readable medium of claim 20, the instructions further comprising:
one or more instructions to provide, via the generated source signal, one or more values associated with the inverse parameter Jacobian matrix at a particular time step during the simulation of the executable graphical model.

22. The non-transitory computer-readable medium of claim 18, the instructions further comprising:
one or more instructions to determine that a quantity of the selected one or more target output points equals a quantity of the one or more system parameters;
one or more instructions to determine that a unique solution exists to the one or more tuning values for the one or more parameters, based on determining that the quantity of the selected one or more target output points equals the quantity of the one or more system parameters; and
one or more instructions to provide the one or more tuning values for the one or more parameters as the determined unique solution.

23. The non-transitory computer-readable medium of claim 18, the instructions further comprising:
one or more instructions to determine that a quantity of the selected one or more target output points is less than a quantity of the one or more system parameters; and
one or more instructions to determine that more than one solution, to the one or more tuning values for the one or more parameters, exists based on determining that the quantity of the selected one or more target output points is less than the quantity of the one or more system parameters.

24. The non-transitory computer-readable medium of claim 23,
where the one or more instructions to provide, for display via the graphical user interface, the one or more tuning values include one or more instructions to provide, to a user via the graphical user interface, a tooltip that includes at least a subset of the more than one solution, and
where the instructions further comprise one or more instructions to receive a selection of one or more solutions, from the at least a subset of the more than one solution, from the user.

25. The non-transitory computer-readable medium of claim 23, the instructions further comprising:
one or more instructions to select one of the more than one solution based on one or more optimization criteria.

26. The non-transitory computer-readable medium of claim 25, where the one or more optimization criteria include at least one of:
one or more cost functions associated with the executable graphical model; or
a criterion specified by a user in connection with a request to determine the one or more tuning values for the one or more parameters.

27. The non-transitory computer-readable medium of claim 25, where the one or more instructions to select the one of the more than one solution based on the one or more optimization criteria include:
one or more instructions to determine sensitivities associated with particular ones of the one or more parameters;
one or more instructions to rank the one or more parameters based on the determined sensitivities;
one or more instructions to select top n parameters from the ranked one or more parameters,
where n corresponds to a quantity of the selected one or more target output points; and
one or more instructions to generate an inverse parameter Jacobian matrix based on the selected top n parameters, the one or more tuning values being determined based on the inverse parameter Jacobian matrix.

28. The non-transitory computer-readable medium of claim 27, where a sensitivity associated with a particular one of the one or more parameters is based on a value of a partial derivative of the particular one of the one or more parameters with respect to one or more system equations at a time value associated with the selected one or more target output points.

29. The non-transitory computer-readable medium of claim 18, the instructions further comprising:
one or more instructions to determine that a quantity of the one or more target output points is greater than a quantity of the one or more parameters;

one or more instructions to determine that no solution, to the one or more tuning values for the one or more parameters, exists based on determining that the quantity of the selected one or more target output points is greater than the quantity of the one or more parameters;

one or more instructions to compute an approximation to the one or more plots, when no solution, to the one or more tuning values for the one or more parameters, exists, where the approximation includes a quantity of target output points equal to the quantity of the one or more parameters; and one or more instructions to determine the one or more tuning values for the one or more parameters based on the approximation.

30. The non-transitory computer-readable medium of claim 29, where a first one of the one or more target output points is associated with an importance rating that is higher than a threshold and a second one of the one or more target output points is associated with an importance rating that is lower than the threshold, and where the one or more instructions to compute the approximation to the one or more plots include:
one or more instructions to disregard the second one of the one or more target output points.

31. The non-transitory computer-readable medium of claim 18, where the point is located within a tolerance limit associated with the plotted data.

32. The non-transitory computer-readable medium of claim 18, where the one or more instructions to provide, for display via the graphical user interface, the one or more tuning values include:

one or more instructions to provide an indication of one of the determined one or more tuning values, associated with a particular parameter of the one or more parameters, in connection with a block associated with the particular parameter.

33. A computing device, comprising:

a memory storing executable instructions for implementing an executable graphical model of a dynamic system; and a processor to:
interact with one or more plots associated with a simulation of the executable graphical model,
the one or more plots being graphically displayed;
detect a selection of one or more target output points associated with the one or more plots based on a user interaction with a point on the graphically displayed one or more plots,
where the point is located within a particular distance from plotted data of the one or more plots;
provide, via a graphical user interface, one or more system parameters, associated with the executable model, that are tunable;
detect a selection identifying one or more parameters, associated with the one or more plots, of one or more system parameters associated with the executable graphical model;
generate a parameter sensitivity for the one or more parameters;
determine one or more tuning values for the one or more parameters based on the parameter sensitivity and based on the selected one or more target output points; and
provide other plotted data, generated based on the one or more tuning values and the selected one or more target output points, for display via the graphical user interface.

* * * * *

UNITED STATES PATENT AND TRADEMARK OFFICE
CERTIFICATE OF CORRECTION

PATENT NO. : 10,430,532 B2
APPLICATION NO. : 15/072183
DATED : October 1, 2019
INVENTOR(S) : Han et al.

Page 1 of 2

It is certified that error appears in the above-identified patent and that said Letters Patent is hereby corrected as shown below:

In the Specification

Column 2, Line 33 reads:
"$y_G$ to the selected target response $yr$. The modeling system"
Should read:
--$y_G$ to the selected target response $y_T$. The modeling system--

Column 5, Lines 59-67 read:
"
$$J_D^R = \begin{bmatrix} \frac{\partial y_1}{\partial u_1} & \cdots & \frac{\partial y_1}{\partial u_j} & \frac{\partial y_1}{\partial P_1} & \cdots & \frac{\partial y_1}{\partial P_N} \\ & & \cdots & & & \\ \frac{\partial y_k}{\partial u_1} & \cdots & \frac{\partial y_k}{\partial u_j} & \frac{\partial y_k}{\partial P_1} & \cdots & \frac{\partial y_k}{\partial P_N} \end{bmatrix} \quad \text{Equation (15)}$$
"
Should read:
--
$$J^R{}_D = \begin{bmatrix} \frac{\partial y_1}{\partial u_1} & \cdots & \frac{\partial y_1}{\partial u_j} & \frac{\partial y_1}{\partial P_1} & \cdots & \frac{\partial y_1}{\partial P_N} \\ & & \cdots & & & \\ \frac{\partial y_k}{\partial u_1} & \cdots & \frac{\partial y_k}{\partial u_j} & \frac{\partial y_k}{\partial P_1} & \cdots & \frac{\partial y_k}{\partial P_N} \end{bmatrix} \quad \text{Equation (15)}$$
--

Column 12, Line 63 reads:
"or Modelica or Dymola from Dassault Systemes."
Should read:
--or Modelica or Dymola from Dassault Systèmes.--

Column 13, Lines 1-2 read:
"View® by National Instruments; Dymola by Dassault Systemes; SoftWIRE by Measurement Computing; WiT by"

Signed and Sealed this
Fourteenth Day of April, 2020

Andrei Iancu
*Director of the United States Patent and Trademark Office*

CERTIFICATE OF CORRECTION (continued)
U.S. Pat. No. 10,430,532 B2

Should read:
--View® by National Instruments; Dymola by Dassault Systèmes; SoftWIRE by Measurement Computing; WiT by--